US011450378B2

(12) United States Patent
Sato et al.

(10) Patent No.: US 11,450,378 B2
(45) Date of Patent: Sep. 20, 2022

(54) APPARATUSES AND METHODS OF POWER SUPPLY CONTROL FOR THRESHOLD VOLTAGE COMPENSATED SENSE AMPLIFIERS

(71) Applicant: Micron Technology, Inc., Boise, ID (US)

(72) Inventors: Toshiyuki Sato, Saitama (JP); Hidekazu Noguchi, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/037,467

(22) Filed: Sep. 29, 2020

(65) Prior Publication Data
US 2022/0101910 A1 Mar. 31, 2022

(51) Int. Cl.
*G11C 11/4091* (2006.01)
*G11C 11/4074* (2006.01)
*G11C 11/408* (2006.01)
*G11C 11/406* (2006.01)
G11C 11/4076 (2006.01)

(52) U.S. Cl.
CPC ...... *G11C 11/4091* (2013.01); *G11C 11/4074* (2013.01); *G11C 11/4087* (2013.01); *G11C 11/40611* (2013.01); G11C 11/4076 (2013.01)

(58) Field of Classification Search
CPC .................................................. G11C 11/4074
See application file for complete search history.

(56) References Cited

U.S. PATENT DOCUMENTS

| 5,508,965 A * | 4/1996 | Nomura | G11C 7/065 |
| | | | 365/206 |
| 6,075,744 A * | 6/2000 | Tsern | G11C 8/08 |
| | | | 365/222 |
| 9,355,697 B2 * | 5/2016 | Earle | G11C 8/10 |

(Continued)

FOREIGN PATENT DOCUMENTS

WO    2022072032    4/2022

OTHER PUBLICATIONS

Application for PCT Application No. PCT/US21/41169, titled "Apparatuses and Methods of Power Supply Control for Threshold Voltage Compensated Sense Amplifiers", filed Jul. 9, 2021.

(Continued)

*Primary Examiner* — Douglas King
(74) *Attorney, Agent, or Firm* — Dorsey & Whitney LLP

(57) ABSTRACT

Apparatuses including threshold voltage compensated sense amplifiers and methods for compensating same are disclosed. An example threshold voltage compensated sense amplifier according to the disclosure includes circuits, such as a first transistor having a first conductivity type coupled to a first node and a second node; a second transistor having a second conductivity type coupled to the first node and at third node; a plurality of transistors coupled to the second node and further configured to receive a power supply voltage; and a control circuit configured to provide a plurality of control signals to the plurality of transistors. The control circuit provides the plurality of control signals indicative of a first drive strength in a first memory operation and further provides the plurality of signals indicative of a second drive strength in a second memory operation.

19 Claims, 10 Drawing Sheets

(56) References Cited

U.S. PATENT DOCUMENTS

| | | | |
|---|---|---|---|
| 10,043,557 B1* | 8/2018 | Hollis | G11C 8/10 |
| 10,490,289 B2* | 11/2019 | Choo | G11C 16/3427 |
| 10,770,149 B2* | 9/2020 | Shin | G11C 16/30 |
| 2001/0010457 A1 | 8/2001 | Kobayashi et al. | |
| 2002/0027234 A1* | 3/2002 | Kato | H01L 27/092 |
| | | | 257/207 |
| 2003/0197520 A1* | 10/2003 | Rearick | G01R 31/3185 |
| | | | 324/750.3 |
| 2007/0183236 A1 | 8/2007 | Jeong | |
| 2008/0019201 A1* | 1/2008 | Seno | G11C 7/02 |
| | | | 365/203 |
| 2015/0348611 A1 | 12/2015 | Rim et al. | |
| 2020/0013448 A1 | 1/2020 | Brown et al. | |
| 2020/0176034 A1 | 6/2020 | Kawamura | |

OTHER PUBLICATIONS

International Search Report and Written Opinion received in PCT/US2021/041169 dated Oct. 26, 2021.

* cited by examiner

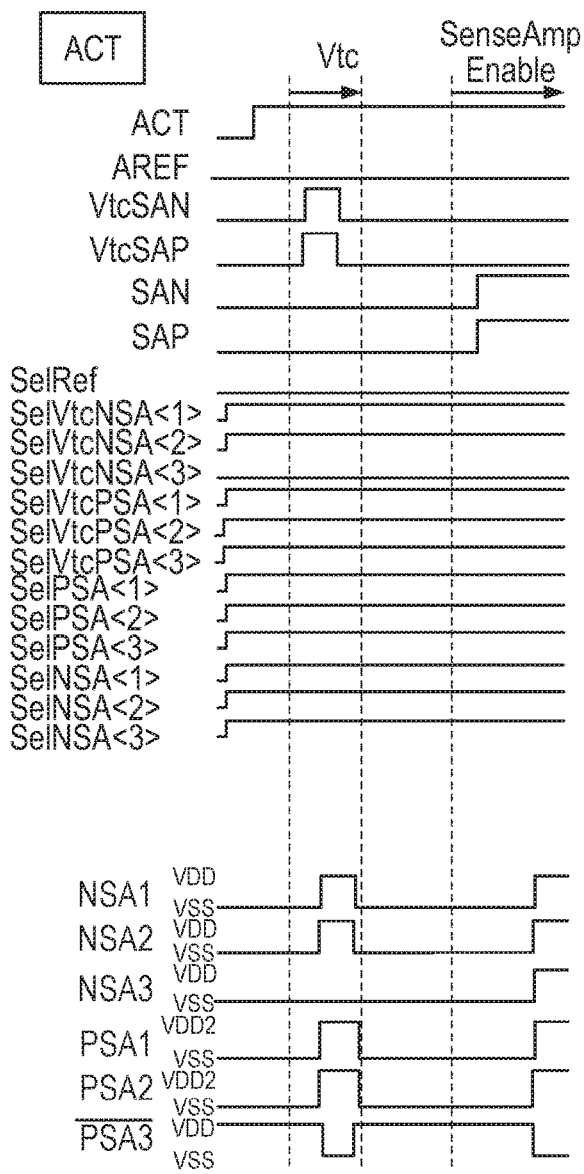
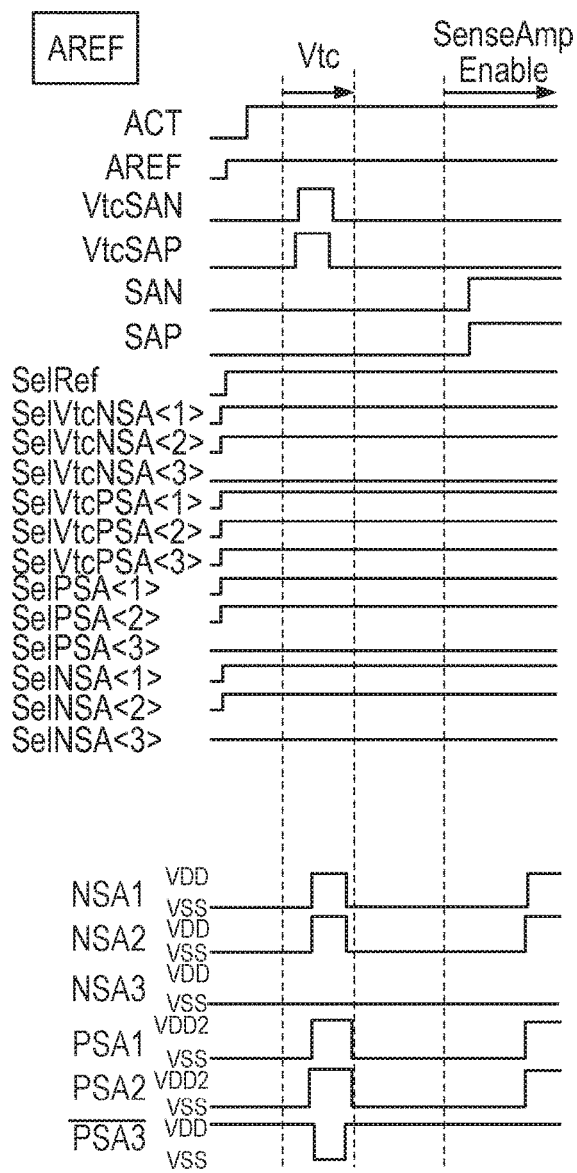
FIG. 8A                    FIG. 8B

APPARATUSES AND METHODS OF POWER SUPPLY CONTROL FOR THRESHOLD VOLTAGE COMPENSATED SENSE AMPLIFIERS

BACKGROUND

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. The change in voltage on the digit line may be amplified by a sense amplifier to indicate the value of the data state stored in the memory cell.

Conventional sense amplifiers are typically coupled to a pair of complementary digit lines to which a large number of memory cells are coupled. As known in the art, when memory cells are accessed, a row of memory cells are activated and sense amplifiers are used to amplify a data state for a respective column of activated memory cells by coupling each of the digit lines of the selected column to voltage supplies such that the digit lines have complementary logic levels.

When a memory cell is accessed, the voltage of one of the digit lines increases or decreases slightly, depending on whether the memory cell coupled to the digit line is charged or not, resulting in a voltage difference between the digit lines. While the voltage of one digit line increases or decreases slightly, the other digit line serves as a reference for the sense amplifier. Respective transistors are enabled due to the voltage difference, thereby coupling the slightly higher voltage digit line to a supply voltage and the other digit line to a reference voltage, such as ground to further drive each of the digit lines in opposite directions and amplify the selected digit line signal.

The digit lines are precharged to a precharge voltage during a precharge phase, such as one-half of a supply voltage, so that a voltage difference can be accurately amplified during a subsequent access operation. However, due to random threshold voltage mismatch of transistor components, the digit lines may be imbalanced before a voltage change is amplified on the digit lines. Such threshold voltage deviations can cause the sense amplifier to erroneously amplify the input signals.

To address the above threshold voltage deviations, sense amplifier designs that alleviate threshold voltage mismatches have been developed. However, such voltage compensation for different operations responsive to different commands (e.g., an activate command "ACT" and an auto-refresh command "AREF") may cause undesirable effects. Thus, voltage compensation for variations across operations is desired.

BRIEF DESCRIPTION OF THE DRAWINGS

FIGS. 8A and 8B are timing diagrams of various signals related to sense amplifier operations and voltage compensation strength control according to an embodiment of the disclosure.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
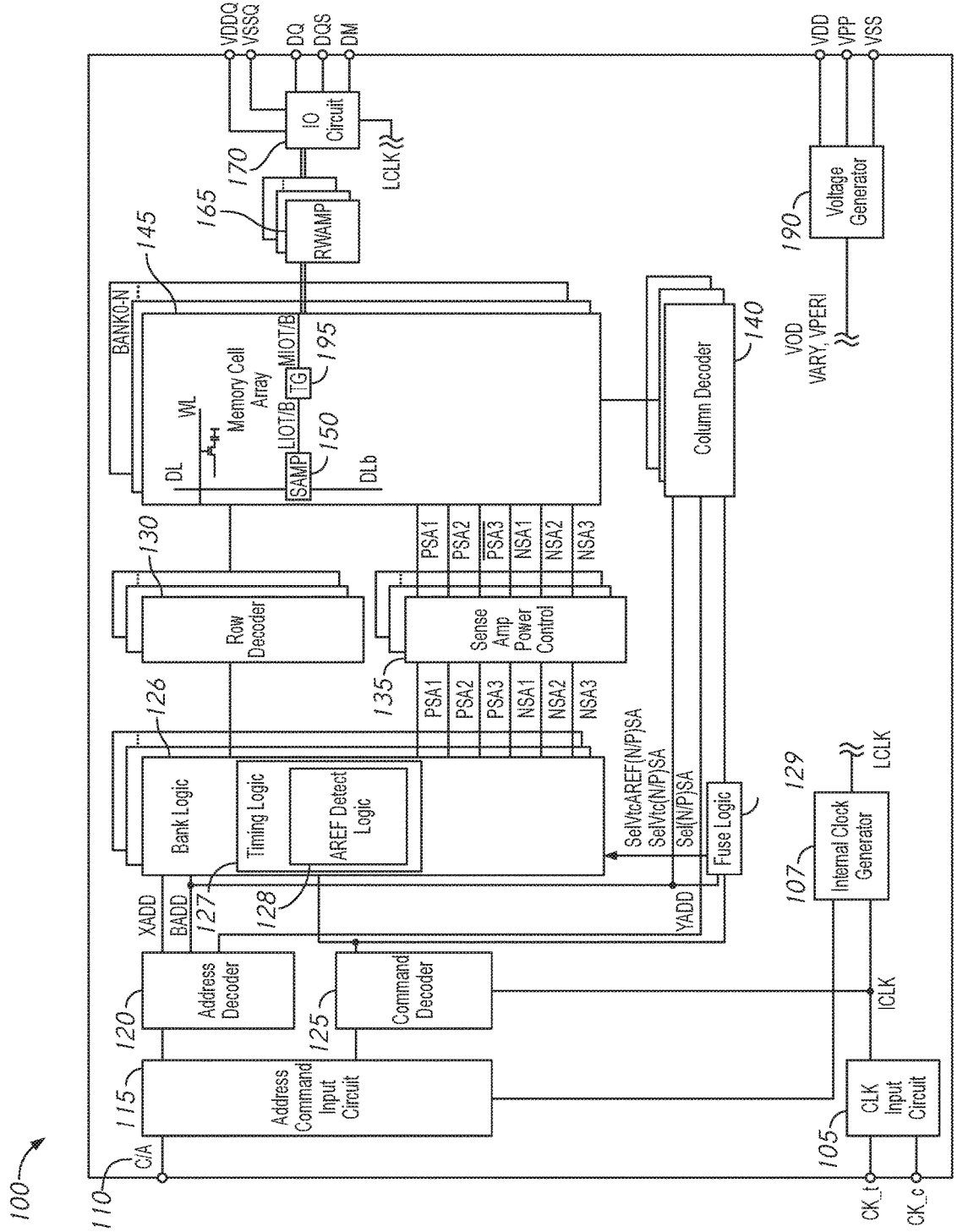
FIG. 1 is a schematic block diagram of a semiconductor device according to an embodiment of the disclosure.

FIG. 1 is a schematic block diagram of a semiconductor device 100, in accordance with an embodiment of the present disclosure. The semiconductor device 100 may include a clock input circuit 105, an internal clock generator 107, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK_t and CK_c, data terminals DQ, DQS, and DM, and power supply terminals VDD, VSS, VDDQ, and VSSQ. The terminals and signal lines associated with the command/address bus 110 may include common terminals and signal lines that are configured to receive both command signal and address signals. In other examples, the terminals and signal lines associated with the command and address bus 110 may include a first set of terminals and signal lines that are configured to receive the command signals and a separate, second set of terminals and signal lines that configured to receive the address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of digit lines DL and DLb, and a plurality of memory cells MC arranged at intersections of the plurality of word lines WL and the plurality of digit lines DL/DLb. The selection of the word line WL for each bank BANK0-N is performed by a corresponding row decoder 130 and the selection of the digit line DL/DLb is performed by a corresponding column decoder 140. The plurality of sense amplifiers 150 are coupled to their corresponding digit lines DL and DLb, and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof.

In some examples, the plurality of sense amplifiers 150 may include threshold voltage compensation circuitry that compensates for threshold voltage differences between components of the sense amplifiers 150. As circuit components become smaller, clock speeds become faster, and voltage/power consumption requirements are reduced, small variances in the performance between circuit components of the sense amplifiers 150 may reduce operational reliability of the semiconductor device 100. To mitigate effects of these variations, compensating for some of these threshold voltage Vt differences may include, before activating the sense amplifier 150 to sense data, biasing internal (sense) nodes of the sense amplifier 150 that are coupled to digit lines DL and DLb and that are configured to provide amplified data to an output node. The bias of the internal nodes may be based on threshold differences between at least two circuit components (e.g., transistors) of the sense amplifier 150. While compensating for threshold voltage Vt differences between circuit components within the sense amplifier 150 may improve reliability.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. The internal command signals may be used to control operation and timing of various circuits of the semiconductor device 100. For example, the internal command signals may include row and column command signals to control circuits to perform access operations to selected word lines and digit lines, such as a read command or a write command.

Accordingly, when activate and read commands are issued and a row address and a column address are timely supplied with the activate and read commands, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when activate and write commands are issued and a row address and a column address are timely supplied with the activated and write commands, and the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

For each memory bank BANK0-7, a bank logic circuit 126 may be included. The bank logic circuit 126 may allow one or more row addresses to be generated locally at the memory bank BANK0-7 during an auto refresh operation responsive to an auto refresh command AREF. In some embodiments, the hank logic circuit 126 may receive the internal command signals from the command decoder 125. The bank logic circuit 126 may include a timing logic circuit 127 and an AREF detect logic circuit 128. The AREF detect logic circuit 128 may be included in the timing logic circuit 127. The AREF detect logic circuit 128 may determine whether the internal command signal is the auto refresh command AREF indicative of the auto refresh operation. The fuse logic circuit 129 may store drive strength information regarding drive strengths of transistors in the sense amplifiers 150. The fuse logic circuit 129 may provide drive strength information regarding drive strengths of transistors. For example, the fuse logic circuit 129 may provide drive strength control signals SelNSA and SelPSA indicative of drive strength information regarding drive strengths of transistors during a sense amplifier enable phase. The fuse logic circuit 129 may also provide drive strength control signals SelVtcNSA and SelVtcPSA indicative of drive strength information regarding drive strengths of transistors during a threshold voltage compensation (VtC) phase while being responsive to an activate command ACT. Furthermore, the fuse logic circuit 129 may provide drive strength control signals SelVtcAREFNSA and SelVtcAREFPSA indicative of drive strength information regarding drive strengths of transistors during a threshold voltage compensation (VtC) phase while being responsive to an auto refresh command AREF. The bank logic circuit 126 may provide transistor activation signals PSA1bar, PSA2bar, PSA3bar, NSA1bar, NSA2bar, NSA3bar to a sense amplifier power control circuit 135, responsive to drive strength control signals. Activation of the transistor activation signals PSA1bar, PSA2bar, PSA3bar, NSA1bar, NSA2bar, NSA3bar is controlled by timing logic circuit 127 and AREF detect logic circuit 128. The sense amplifier power control circuit 135 may provide control signals PSA1, PSA2, PSA3bar, NSA1, NSA2, and NSA3 to the sense amplifiers 150 in the memory cell array 145.

Turning to the explanation of the external terminals included in the semiconductor device 100, the clock terminals CK_t and CK_c may receive an external clock signal and a complementary external clock signal, respectively.

The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the K) circuit 170. The IO circuit 170 may use the phase controller internal clock signal LCLK as a timing signal for determining an output timing of read data.

The power supply terminals may receive power supply voltages VDD, VPP and VSS. These power supply voltages VDD and VSS may be supplied to a voltage generator circuit 190. The voltage generator circuit 190 may generate various internal voltages, VDD2, VOD, VARY, VPERI, and the like based on the power supply voltages VDD and VSS. The voltage VPP is mainly used in the row decoder 130, the internal voltages VDD2, VOD, and VARY are mainly used in the sense amplifiers 150 included in the memory cell array 145, and the internal voltage VPERI is used in many other circuit blocks. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
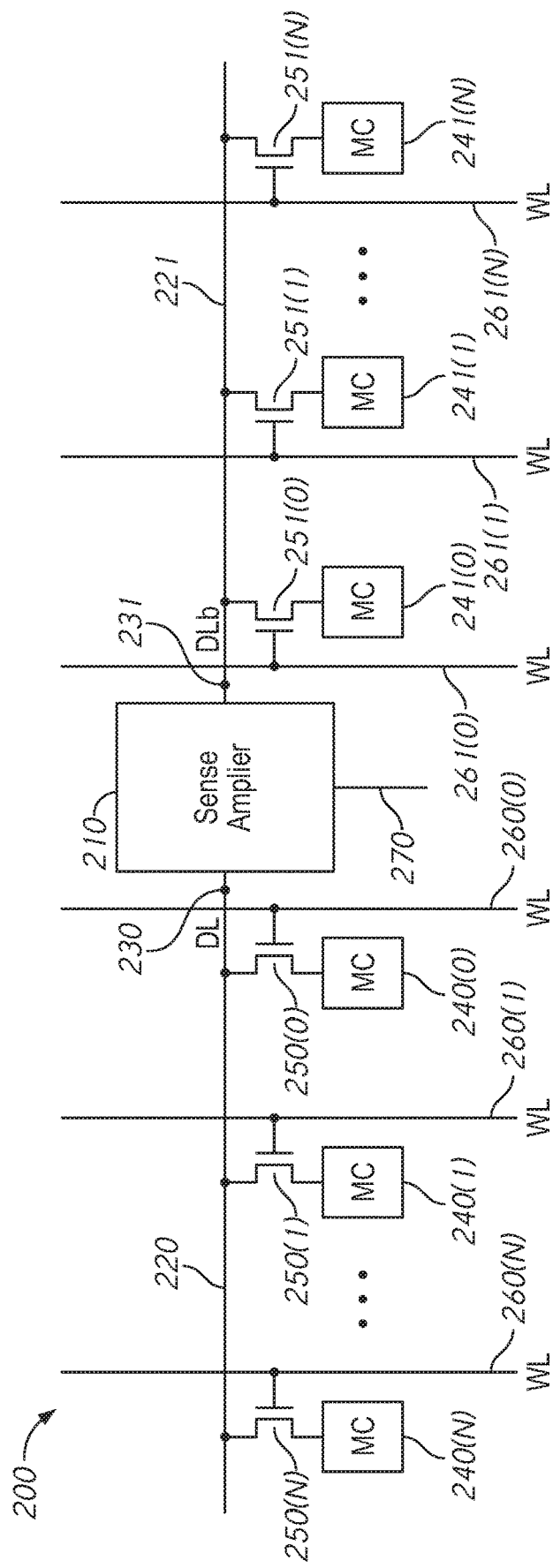
FIG. 2 is a schematic diagram of a sense amplifier and a pair of complementary digit lines according to an embodiment of the disclosure.

FIG. 2 is a schematic diagram of a portion of a memory 200 that includes a sense amplifier 210 and a pair of complementary digit lines DL 220 and DLb 221 according to an embodiment of the disclosure. As shown in FIG. 2, the sense amplifier 210 is coupled to the pair of true and complementary digit (or bit) lines DL 220 and DLb 221 at sense nodes 230 and 231, respectively. The memory cells 240(0)-(N) may be selectively coupled through respective access devices (e.g., transistors) 250(0)-(N) to the digit line DL 220 and memory cells 241(0)-(N) may be selectively coupled through respective access devices e.g., transistors) 251(0)-(N) to the digit line DMb 221. Wordlines WL 260 (0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DLb 221 by controlling a gate of a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof.

In some examples, the memory 200 may operate in general phases or modes. A first phase (e.g., precharge phase) may be initiated in response to a precharge command. During the precharge phase, the wordlines WL 260(0)-(N) and 261(0)-(N) may be set to an inactive state, and in response, the access devices 250(0)-(N) and 251(0)-(N) may all be disabled. Further, the digit lines DL 220 and DLb 221 and internal nodes of the sense amplifier 210 may be precharged to and held at a precharge voltage, such as a digit line precharge voltage VBLP, until transitioning to a second phase.

In some examples, sense amplifier 210 includes threshold voltage compensation circuitry that compensates for threshold voltage mismatches between components of the sense amplifier 210 during a threshold voltage compensation phase. To perform the threshold voltage compensation, the sense amplifier 210 may, during a threshold voltage compensation phase, bias sense nodes 230 and 231 of the sense amplifier 210 such that a voltage difference between the sense nodes 230 and 231 is approximately equal to threshold voltage differences between at least two circuit components of the sense amplifier 210. In some examples, the threshold voltage difference may be based on threshold voltages of transistors of the sense amplifier 210. Compensating for threshold voltage Vt differences between circuit components within the sense amplifier 210 may improve reliability and accuracy.

A third phase may be a cell information sampling phase. During the sampling phase, a wordline WL of the wordlines WL 260(0)-(N) and 261(0)-(N) may be set to an active state, and, in response, an access device of the access devices 250(0)-(N) and 251(0)-(N) may be enabled to couple a respective memory cell of the memory cells 240(0)-(N) and 241(0)-(N) to one of the digit lines DL 220 and DLb 221. When activated, the memory cell provides a stored data state in the form of a voltage (and/or charge) to the digit line, and to a sense node of the sense amplifier 210 to which the digit line is coupled.

A fourth phase is a sense amplifier enable phase. The sense amplifier 210 may be activated to perform a sense operation to sense a data state of the activated memory cell. That is, during a sense operation, a data state stored by the activated memory cell is sensed and amplified by the sense amplifier 210 to drive one of the digit line DL 220 or the digit line DLb 221 to a high or low voltage level corresponding to the sensed data state and to drive the other digit line of the digit lines DL 220 and DLb 221 to the complementary (opposite) voltage level during the sense operation. The circuitry of the memory 200 may remain in the activation phase or may transition back to the precharge phase in response to a precharge command.

With reference to the memory cells 240(0)-(N), a memory cell of the memory cells 240(0)-(N) is coupled to the digit line DL 220 through the respective access device 250(0)-(N) in response to a respective word line 260(0)-(N) becoming active. A data state stored by the memory cell is sensed and amplified by the sense amplifier 210 to drive the digit line DL 220 to a high or low voltage level corresponding to the sensed data state. The other digit line DLb 221 is driven to the complementary voltage level (e.g., the high voltage level is complementary to the low voltage level and the low voltage level is complementary to the high voltage level) during the sense operation. Similarly, a memory cell of the memory cells 241(0)-(N) is coupled to the digit line DLb 221 through the respective access device 251(0)-(N) in response to a respective word line 261(0)-(N) becoming active. A data state stored by the memory cell is sensed and amplified by the sense amplifier 210 to drive the digit line DLb 221 to a high or low voltage level corresponding to the sensed data state. The other digit line DL 220 is driven to the complementary voltage level during the sense operation.

During the threshold voltage compensation operation, the sense nodes 230 and 231 of the sense amplifier 210 may be isolated from one another in response to the control signals 270 (e.g., from a decoder circuit). For example, during the precharge phase, the sense nodes 230 and 231 of the sense amplifier 210 may be coupled to each other, and to a precharge voltage to be precharged to the precharge voltage. While the sense nodes 230 and 231 of the sense amplifier 210 are precharged, the control signals 270 may configure the sense amplifier 210 to isolate the sense nodes 230 and 231 from each other. A voltage difference may then be developed at the sense nodes 230 and 231 to provide threshold voltage compensation.

Figures 3A, 3B:
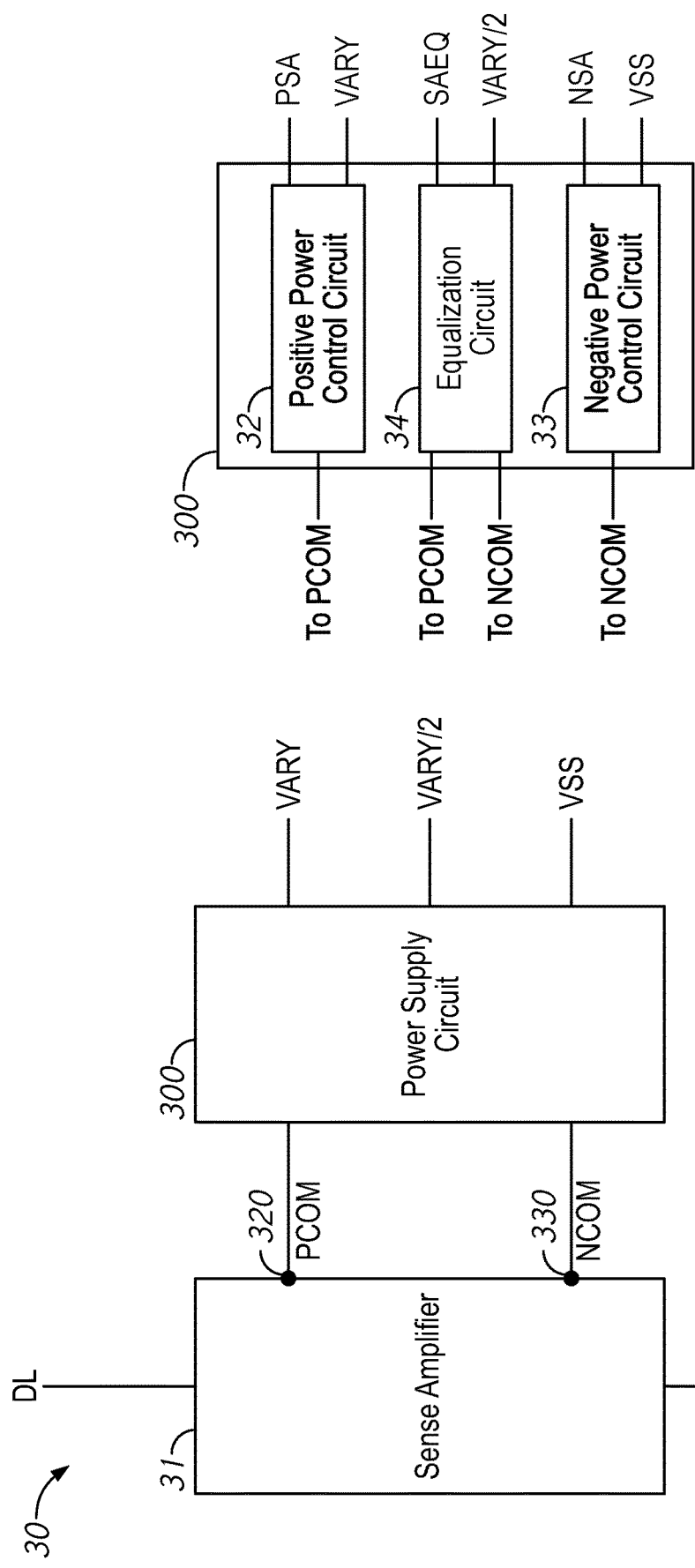
FIG. 3A is a schematic diagram of an apparatus including a sense amplifier and a power supply circuit according to an embodiment of the disclosure.
FIG. 3B is a schematic diagram of the power supply circuit according to an embodiment of the disclosure.

FIG. 3A is a schematic diagram of an apparatus 30 including a sense amplifier 31 and a power supply circuit 300 in accordance with an embodiment of the disclosure. The sense amplifier 31 may be included in one or more of the sense amplifiers 150 of FIG. 1 and/or the sense amplifier 210 of FIG. 2. As previously described, the sense amplifier 31 may drive a digit line DL to a high or low voltage level corresponding to a sensed data state. The sense amplifier 31 may also drive the other digit line DLb to the complementary voltage level (e.g., the high voltage level is complementary to the low voltage level and the low voltage level is complementary to the high voltage level) during the sense operation. The digit line DL may represent digit line DL 220 of FIG. 2 and the digit line DLb may represent digit line DLb 221 in some embodiments of the disclosure.

The sense amplifier 31 may be coupled to a common node PCOM 320 and further coupled to another common node NCOM 330. The common node PCOM 320 may receive an array power supply voltage VARY. The other common node NCOM 330 may receive another power supply voltage VSS (e.g., a ground voltage, or a negative power supply voltage). The power supply circuit 300 may provide the array power voltage VARY to the common node PCOM 320 during a threshold voltage compensation (VtC) phase and a sense amplifier enable phase. The power supply circuit 300 may also provide the other power supply voltage VSS to the common node NCOM 330 during a threshold voltage compensation (VtC) phase and a sense amplifier enable phase. The power supply circuit 300 may provide an equalization voltage VARY/2 to the common nodes PCOM 320 and NCOM 330.

As will be described below, the power supply circuit 300 may provide the sense amplifier 31 with power supply voltages controlled differently depending on memory operations. For example, the power supply circuit 300 may provide a more finely adjusted drive strength to the sense amplifier 31 for different memory operations, in comparison to other sense amplifier designs. In some embodiments of the disclosure, drive strengths are adjustable across a threshold voltage compensation (VtC) phase responsive to an activate command ACT, a VtC phase further responsive to an auto refresh operation AREF, and a sense amplifier enable phase responsive to control signals. As a result, in apparatuses with sense amplifiers according to embodiments of the disclosure, including the apparatus 30 of FIG. 3A, the power supply circuit 300 may provide the sense amplifier 31 with a more finely adjusted threshold voltage compensation across different memory operations, for example, such as memory activation signaled by an activate command ACT and an auto refresh operation signaled by an auto refresh command AREF.

FIG. 3B is a schematic diagram of the power supply circuit 300 according to an embodiment of the disclosure. The power supply circuit 300 may include a positive power control circuit 32, a negative power control circuit 33 and an equalization circuit 34.

The positive power control circuit 32 may receive a positive power supply voltage, such as an array voltage VARY. The positive power control circuit 32 may also receive one or more control signals PSA. Depending on the one or more control signals PSA, the positive power control circuit 32 may provide may adjust a drive strength in providing the positive power supply voltage to the common node PCOM. In some embodiments, the drive strength may be increased responsive to an active command ACT and the drive strength may be decreased responsive to an auto refresh command AREF during a threshold voltage compensation (VtC) phase. In another embodiments, the drive strength may be increased responsive to an active command ACT and the drive strength may be decreased responsive to an auto refresh command AREF during a sense amplifier enable phase.

The negative power control circuit 32 may receive a negative power supply voltage VSS (e.g., a ground voltage, or a negative power supply voltage). The negative power control circuit 33 may also receive one or more control signals NSA. Depending on the one or more control signals NSA, the negative power control circuit 33 may provide may adjust a drive strength in providing the negative power supply voltage to the common node NCOM. In some embodiments, the drive strength may be decreased responsive to an active command ACT and the drive strength may be increased responsive to an auto refresh command AREF during a threshold voltage compensation (VtC) phase. In another embodiments, the drive strength may be increased responsive to an active command ACT and the drive strength may be decreased responsive to an auto refresh command AREF during a sense amplifier enable phase.

The equalization circuit 34 may receive a control signal SAEQ and an equalization voltage, such as a half of the array voltage VARY/2. The control signal SAEQ may be activated during a cell information sampling phase, after the threshold voltage compensation (VtC) phase and before the sense amplifier enable phase. Responsive to the active control signal SAEQ, the equalization circuit 34 may couple the common nodes PCOM 320 and NCOM 330 and provide the equalization voltage VARY/2 to the common nodes PCOM 320 and NCOM 330.

Figures 3C, 3D:
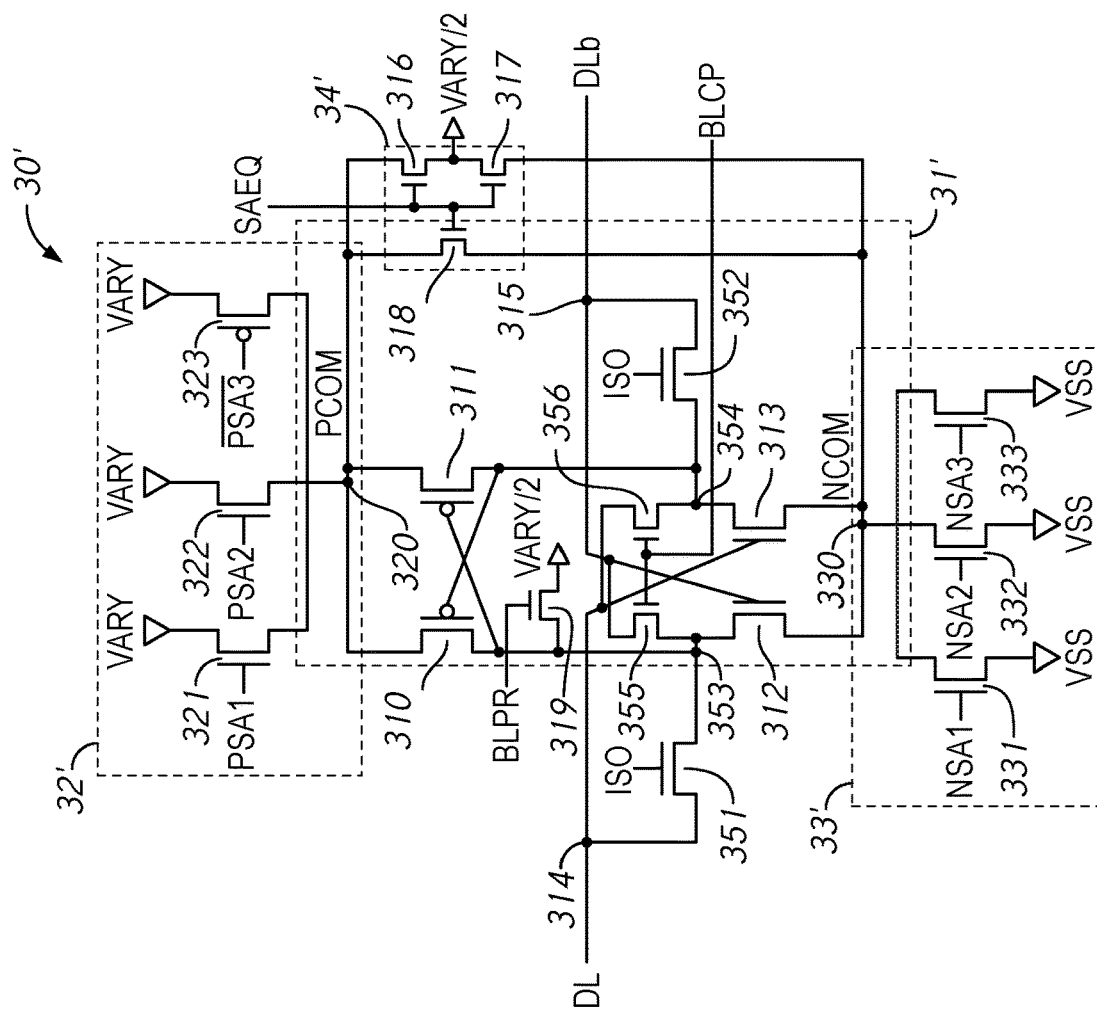
FIG. 3C is a schematic diagram of an apparatus including a sense amplifier according to an embodiment of the disclosure.
FIG. 3D is a truth table of a combination of control signals to the power supply circuit the sense amplifier of FIG. 3C, according to an embodiment of the present disclosure.

FIG. 3C is a schematic diagram of an apparatus 30' including a sense amplifier 31' in accordance with an embodiment of the disclosure. The apparatus 30' may be the apparatus 30 of FIG. 3A and the sense amplifier 31' may be the sense amplifier 31 of FIG. 3A. The sense amplifier 31' may be included in one or more of the sense amplifiers 150 of FIG. 1 and/or the sense amplifier 210 of FIG. 2.

The sense amplifier 31' includes first type of transistors (e.g., p-type field effect transistors (PFET)) 310 and 311 having drains coupled to nodes 353 and 354, respectively. The sense amplifier 31 further includes second type of transistors (e.g., n-type field effect transistors (NFET)) 312 and 313 having drains coupled to the nodes 353 and 354, respectively. The nodes 353 and 354 may be configured to be coupled to (sense) nodes 314 and 315 through isolation transistors 351 and 352, all respectively. Sources of the isolation transistors 351 and 352 are coupled to the nodes 314 and 315 and drains of the transistors 351 and 352 are coupled to the nodes 353 and 354, respectively. The nodes 353 and 354 may further be configured to be coupled to (sense) nodes 315 and 314 through transistors 355 and 356, respectively. Gates of the transistors 355 and 356 may receive a control signal BLCP, which may become active during precharge phase and during a threshold voltage compensation (VtC) phase. Sources of the isolation transistors 351 and 352 are coupled to the nodes 314 and 315 and drains of the isolation transistors 351 and 352 are coupled to the nodes 353 and 354, respectively. Gates of the transistor 312 and 313 are coupled to the nodes 315 and 314, respectively. Gates of the transistors 310 and 311 are configured to be coupled to the nodes 315 and 314 through the isolation transistors 351 and 352, respectively. Gates of the isolation transistors 351 and 352 may receive an isolation control signal ISO, which becomes inactive during the VtC phase until a phase when the sense amplifier 31' is enabled.

Sources of the transistors 310 and 311 are coupled to a common node PCOM 320 that is configured to receive an array power supply voltage VARY through a number of transistors that provides a combined drive strength. For example, in the embodiment of FIG. 3C, a positive power supply circuit 32' includes transistors 321, 322 and 323 that are coupled to the common node PCOM 320. The transistors 321, 322 and 323 may provide the array power supply voltage VARY to the common node PCOM 320 with the combined drive strength when activated. However, other embodiments of the disclosure may include a greater or fewer number of transistors consisting the positive power supply circuit 32' that are coupled to the common node PCOM 320 than shown in the particular example of FIG. 3C. Sources of the transistors 312 and 313 are coupled to a common node NCOM 330 that is configured to receive another power supply voltage VSS (e.g., a ground voltage, or a negative power supply voltage) through a number of transistors that provides a combined drive strength. For example, in the embodiment of FIG. 3C, a negative power supply circuit 33' includes transistors 331, 332 and 333 are coupled to the common node NCOM 330. The transistors 331, 332 and 333 may provide the power supply voltage VSS to the common node NCOM 330 with the combined drive strength when activated. However, other embodiments of the disclosure may include a greater or fewer number of transistors consisting the negative power supply circuit 33' that are coupled to the common node NCOM 330 than shown in the particular example of FIG. 3C. A digit line DL is coupled to the node 314 and a digit line DLb is coupled to the node 315. The digit line DL may represent digit line DL 220 of FIG. 2 and the digit line DLb may represent digit line DLb 221, and the nodes 314 and 315 may represent sense nodes 230 and 231, respectively, in some embodiments of the disclosure.

The sense amplifier 31' further includes a precharge transistor 319 coupled to the node 353. In this embodiment, the transistor 319 is coupled to the node 353; however, in some embodiments, the transistor 319 may be coupled to the node 354 additionally or alternatively. The transistor 319 provides a voltage from its source to node 353 when activated by an active control signal BLPR (e.g., high logic level) during the precharge phase. In some embodiments of the disclosure, a voltage VARY/2 that is about a half voltage of an array power supply voltage VARY may be provided to the node 353 when the transistor 319 is active.

For example, in the embodiment of FIG. 3C, an equalization circuit 34' includes transistors 316, 317 and 318 that may be activated by a control signal SAEQ. The control signal SAEQ may be activated first during the precharge phase and second after a completion of the VtC phase before a sense amplifier enable phase starts. When activated by the active control signal SAEQ, the transistor 318 provides a conductive path between a common node PCOM 320 and another common node NCOM 330 to equalize the respective node voltages. Further, activated by the active control signal SAEQ, the transistors 316 and 317 may provide the voltage VARY/2 to the common nodes PCOM 320 and NCOM 330.

The transistors 321, 322 and 323 in the positive power supply circuit 32' have one node configured to receive an array power supply voltage VARY and another node coupled to the common node PCOM 320, thus the transistors 321, 322 and 323 are coupled to each other in parallel. The transistors 321, 322 and 323 have gates that may receive control signals PSA1, PSA2, and PSA3bar, respectively. The control signals PSA1, PSA2 may have a voltage range (e.g., voltage swing) from another power supply voltage VSS (e.g., a ground voltage, or a negative power supply voltage) to a power supply voltage VDD2 that is higher than the power supply voltage VDD. The control signal PSA3bar is the complement of a control signal PSA3, and may have a voltage range from the power supply voltage VSS to the power supply voltage VDD. In some embodiments, a drive strength (e.g., capacitance per time unit) of the transistor 321 may be about four times a strength of the transistor 323 and a drive strength (e.g., capacitance per time unit) of the transistor 322 may be about twice the strength of the transistor 323.

The transistors 331, 332 and 333 in the negative power supply circuit 33' have one node configured to receive a power supply voltage VSS (e.g., a ground voltage, or a negative power supply voltage) and another node coupled to the common node NCOM 330, thus the transistors 331, 332 and 333 are coupled to each other in parallel. The transistors 331, 332 and 333 have gates that may receive control signals NSA1, NSA2, and NSA3, respectively. The control signals NSA1, NSA2 and NSA3 may have a voltage range (e.g., voltage swing) from the power supply voltage VSS to a power supply voltage VDD. In some embodiments, a drive strength (e.g., capacitance per time unit) of the transistor 331 may be about four times a strength of the transistor 333 and a drive strength (e.g., capacitance per time unit) of the transistor 332 may be about twice the drive strength (e.g., capacitance per time unit) of the transistor 333.

In some embodiments, the transistors 321 and 322 may be NFETs and the transistor 323 may be a PFET. In some embodiments, the transistors 331, 332 and 333 may be NFETs. The transistors 310 and 311 are shown as PFETs and the transistors 312, 313, 316, 317, 318, 319, 351, 352, 355 and 356 are shown as NFETs in FIG. 3. However, one or more of the transistors may be changed to a different conductivity type, and/or to a different transistor, to a different circuit without departing from the scope of the disclosure.

As will be described below, the apparatus 30' may provide the sense amplifier 31' with threshold voltage compensation. The apparatus 30' may provide advantages over conventional apparatuses providing sense amplifiers with threshold voltage compensation. For example, the apparatus 30' or related circuits may provide a more finely adjusted drive strength to the sense amplifier 31 for different memory operations by activating a combination of the transistors 321, 322, 323, 331, 332 and 333, in comparison to other sense amplifier designs. In some embodiments of the disclosure, drive strengths are adjustable across a threshold voltage compensation (VtC) phase responsive to an activate command ACT, a VtC phase further responsive to an auto refresh operation AREF, and a sense amplifier enable phase responsive to control signals. Modifications including changing any transistor to a different type, to a different size, to a different circuit, and/or changing to a different number of transistors in place of the transistors 321, 322 and 323, or the transistors 331, 332, and 333 are within the scope of disclosure. As a result, apparatuses with sense amplifiers according to embodiments of the disclosure, including the apparatus 30' of FIG. 3C, may provide the sense amplifier 31' with a more finely adjusted threshold voltage compensation across different memory operations, for example, such as memory activation signaled by an activate command ACT and auto refresh operation signaled by an auto refresh command AREF.

FIG. 3D is a truth table of a combination of control signals in the sense amplifier of FIG. 3C, in accordance with an embodiment of the present disclosure.

For example, when all the control signals PSA1, PSA2, PSA3, NSA1, NSA2 and NSA3 are set to a logic low level (OFF) and PSA3 bar is set to a logic high level, then the combined drive strength is 0%. When the control signals PSA3 and NSA3 are set to a logic high level (ON) and the other control signals are set to OFF, transistors 323 and 333 having the drive strength 1 out of (4+2+1) are conductive, thus the combined drive strength is 1/7=14.3%. When the control signals PSA2 and NSA2 are set to a logic high level (ON) and the other control signals are set to OFF, transistors 322 and 332 having the drive strength 2 out of (4+2+1) are conductive, thus the combined drive strength is 2/7=28.6%. When the control signals PSA2, PSA3 and NSA2, NSA3 are set to a logic high level (ON) and the other control signals are set to OFF, transistors 322, 332, and 333 having the drive strength 3 out of (4+2+1) are conductive, thus the combined drive strength is (1+2)/7=42.9%. When the control signals PSA1 and NSA1 are set to a logic high level (ON) and the other control signals are set to OFF, transistors 321 and 331 having the drive strength 4 out of (4+2+1) are conductive, thus the combined drive strength is 4/7=57.1%. When the control signals PSA1, PSA3 and NSA1, NSA3 are set to a logic high level (ON) and the other control signals are set to OFF, the combined drive strength is (4+1)/7=71.4%. When the control signals PSA1, PSA2 and NSA1, NSA2 are set to a logic high level (ON) and the other control signals are set to OFF, the combined drive strength is (4+2)/7=85.7%. When all the control signals PSA1, PSA2, PSA3 NSA1, NSA2 and NSA3 are set to a logic high level (OFF) and PSA3 bar is set to a logic low level, then the combined drive strength is 100%. In this manner, a combination of control signals and different drive strength of transistors may provide adjustable drive strengths. Different drive strength may be used between a threshold voltage compensation phase and a sense amplifier enable phase. Furthermore, by providing the control signals of different activation combinations across different memory operations, different drive strength can be provided to the sense amplifier in the threshold voltage compensation phase responsive to different commands, such as the activate command ACT and the auto refresh command AREF.

Figure 4A:
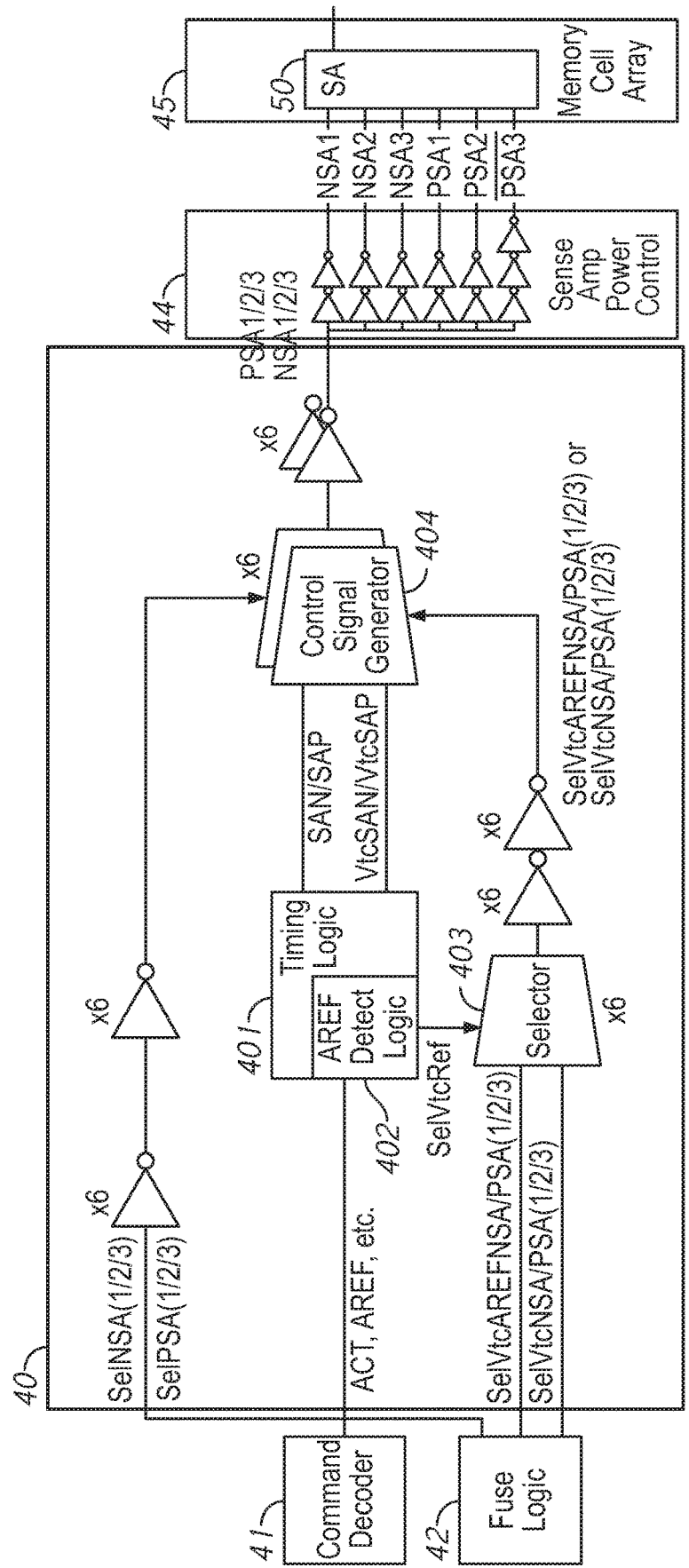
FIG. 4A is a schematic diagram of an apparatus including a drive strength control circuit according to an embodiment of the disclosure.

FIG. 4A is a schematic diagram of an apparatus including a drive strength control circuit 40 according to an embodiment of the disclosure. The drive strength control circuit 40 may be included in a peripheral region of a semiconductor device 100 of FIG. 1. For example, the bank logic circuit 126 of FIG. 1 may include the drive strength control circuit 40. Alternatively, the row decoder 130 of FIG. 1 may include a bank logic circuit including the drive strength control circuit 40. A command decoder 41 may provide internal command signals to the drive strength control circuit 40. For example, the command decoder 41 may be the command decoder 125 of FIG. 1. For example, the internal command signals may include a command signal indicative of an activation responsive to an activate command ACT and a command signal indicative of auto refresh (AREF) operation.

The drive strength control circuit 40 may include a timing logic circuit 402. The timing logic circuit 402 may receive the internal command signals from the command decoder 41. Responsive to the internal command signals, the timing logic circuit 402 may provide a timing signal SAN/SAP that may be set to an active state during a sense amplifier enable phase, and a timing signal VtcSAN/VtcSAP that may be set to an active state during a threshold voltage compensation (VtC) phase.

The drive strength control circuit 40 may include an AREF detect logic circuit 402. For example, the AREF detect logic circuit may be the AREF detect logic circuit 128 of FIG. 1. The AREF detect logic circuit 402 may receive the internal command signals from the command decoder 41. For each internal command signal, the AREF detect logic circuit 402 may determine whether the internal command signal is indicative of an auto refresh (AREF) command. If the internal command signal is indicative of the AREF command, then the AREF detect logic circuit 402 may provide a selection signal SelVtcRef in an active state to a plurality of selectors 403 in the drive strength control circuit 40. If the internal command signal is not indicative of the AREF command (e.g., a command indicative of a native memory access operation), then the AREF detect logic circuit 402 may provide the selection signal SelVtcRef in an inactive state to the plurality of selectors 403. A fuse logic circuit 42 may store drive strength information regarding drive strengths of transistors in sense amplifiers associated with a threshold voltage compensation phase and a sense amplifier enable phase. For example, the fuse logic circuit 42 may be the fuse logic circuit 126. The fuse logic circuit 42 may provide drive strength control signals regarding drive strengths of transistors, such as drive strength control signals SelNSA1, SelNSA2, SelNSA3, SelPSA1, SelPSA and SelPSA3, associated with drive strengths of the transistors 331, 332, 333, 321, 322 and 323 of FIG. 3C during the sense amplifier enable phase. The fuse logic circuit 42 may further provide drive strength control signals SelVtcNSA1, SelVtcNSA2, SelVtcNSA3 SelVtcPSA1, SelVtcPSA2, and SelVtcPSA3 associated with drive strengths of the transistors 331, 332, 333, 321, 322 and 323 during a threshold voltage compensation (VtC) phase responsive to an activate command ACT while auto refresh operation is not executed (e.g., a native memory access operation is being executed). Furthermore, the fuse logic circuit 42 may provide drive strength control signals SelVtcAREFNSA1, SelVtcAREFNSA2, SelVtcAREFNSA3, SelVtcAREFPSA1, SelVtcAREFPSA2 and SelVtcAREFPSA3 associated with drive strengths of the transistors 331, 332, 333, 321, 322 and 323 during a threshold voltage compensation (VtC) phase in an auto refresh operation responsive to an auto refresh command AREF.

The plurality of selectors 403 may receive the selection signal SelVtcRef from the AREF detect logic circuit 402, and receive the drive strength control signals SelVtcNSA1, SelVtcNSA2, SelVtcNSA3 SelVtcPSA1, SelVtcPSA2, SelVtcPSA3, SelVtcAREFNSA1, SelVtcAREFNSA2, SelVtcAREFNSA3, SelVtcAREFPSA1, SelVtcAREFPSA2 and SelVtcAREFPSA3 from the fuse logic circuit 42. Responsive to the inactive state of the selection signal SelVtcRef indicative of an operation that is not an auto refresh operation (e.g., in a native memory operation), the plurality of selectors 403 may provide the drive strength control signals SelVtcNSA1, SelVtcNSA2, SelVtcNSA3 SelVtcPSA1, SelVtcPSA2, and SelVtcPSA3. Responsive to the active state of the selection signal SelVtcRef indicative of an auto refresh operation responsive to an auto refresh command AREF, the plurality of selectors 403 may provide the drive strength control signals SelVtcAREFNSA1, SelVtcAREFNSA2, SelVtcAREFNSA3, SelVtcAREFPSA1, SelVtcAREFPSA2 and SelVtcAREFPSA3.

The drive strength control circuit 40 may include a plurality of control signal generator circuits 404. The plurality of control signal generator circuits 404 may receive the timing signals, such as the timing signals SAN/SAP and VtcSAN/VtcSAP, from the timing logic circuit 401. The plurality of control signal generator circuits 404 may receive the drive strength control signals SelNSA1, SelNSA2, SelNSA3, SelPSA1, SelPSA2 and SelPSA3 to be used during the sense amplifier enable phase from the fuse logic circuit 42. The plurality of control signal generator circuits 404 may also receive either the drive strength control signals SelVtcNSA1, SelVtcNSA2, SelVtcNSA3 SelVtcPSA1, SelVtcPSA2 or the drive strength control signals SelVtcAREFNSA1, SelVtcAREFNSA2, SelVtcAREFNSA3, SelVtcAREFPSA1, SelVtcAREFPSA2 and SelVtcAREFPSA3 to be used during the threshold voltage compensation phase from the plurality of selectors 403. Responsive to the active timing signal SAN/SAP indicative of being in the sense amplifier enable phase, the plurality of control signal generator circuits 404 may provide inversed signals of the drive strength control signals SelPSA1, SelPSA2, SelPSA3, SelNSA1, SelNSA2, SelNSA3 as inverse transistor activation signals PSA1bar, PSA2bar, PSA3bar, NSA1bar, NSA2bar, and NSA3bar respectively. Responsive to the active timing signal VtcSAN/VtcSAP indicative of being in the threshold voltage compensation phase, the plurality of control signal generator circuits 404 may provide inversed signals of the drive strength control signals received from the plurality of selectors 403 as the inverse transistor activation signals PSA1bar, PSA2bar, PSA3bar, NSA1bar, NSA2bar, and NSA3bar respectively.

Figure 4B:
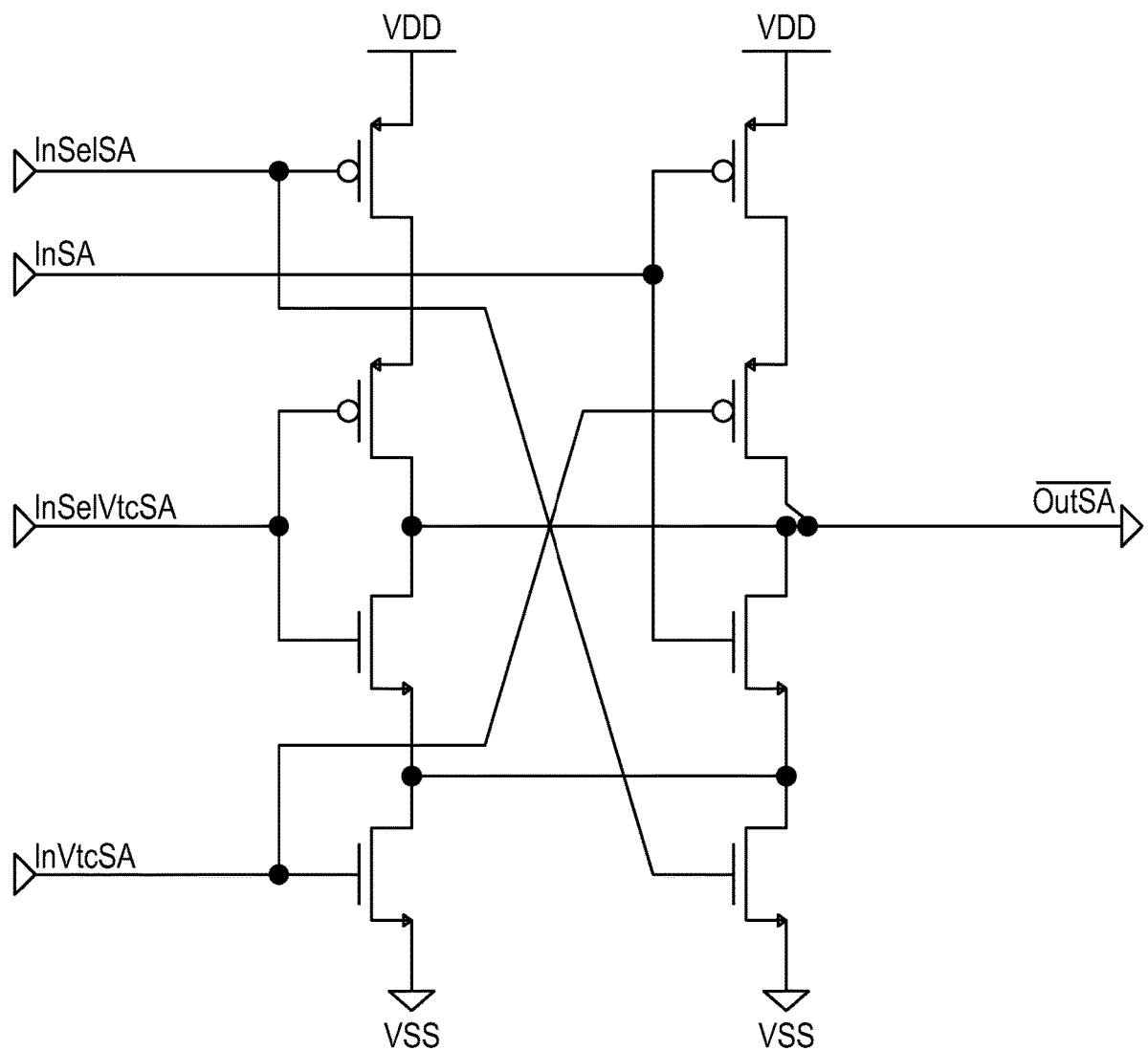
FIG. 4B is a circuit diagram of a control signal generator circuit in the drive strength control circuit according to an embodiment of the disclosure.

FIG. 4B is a circuit diagram of one control signal generator circuit of the plurality of control signal generator circuits 404 in the drive strength control circuit 40 according to an embodiment of the disclosure. Each control signal generator circuit 404 in FIG. 4B may receive the timing signals, such as the a timing signal InSA indicative of a sense amplifier enable phase and InVtcSA indicative of a threshold voltage compensation phase, from the timing logic circuit 401. The control signal generator circuit 404 may receive a drive strength control signal InSelSA to be used during the sense amplifier enable phase and a drive strength control signals InSelVtcSA to be used during the threshold voltage compensation phase. The control signal generator circuit 404 provides an output signal OutSA to a transistor of a sense amplifier. The following logic equation provides a logical relationship between the output signal OutSA and input signals, namely the timing signals InSA and InSelSA and the drive strength control signals InSelSA and InSelVtcSA.

OutSA=!(InVicSA*InSelVtcSA)+(InSA*InelSA))

A sense amplifier power control circuit 44 may receive the inverse transistor activation signals PSA1bar, PSA2bar, PSA3bar, NSA1bar, NSA2bar, and NSA3bar and provide PSA1, PSA2, PSA3bar, NSA1, NSA2, and NSA3 to sense amplifiers 50 in a memory cell array 45. For example, the sense amplifier power control circuit 44, the memory cell array 45 and the sense amplifiers 50 may be the sense amplifier power control circuit 135, the memory cell array 145 and the sense amplifiers 150 in FIG. 1.

The plurality of selectors 403 and the plurality of control signal generators 404 may be provided in a pre-process of generating each control signal of the control signals that are transistor activation signals PSA1, PSA2, PSA3bar, NSA1, NSA2, and NSA3 provided from the sense amplifier power control circuit 44 to the transistors 321, 322, 323, 331, 332, and 333. Thus, the number of the plurality of selectors 403 and the plurality of control signal generators 404 in the drive strength control circuit 40 is six in FIG. 4A. However, depending on a number of transistors used for adjusting a drive strength of a sense amplifier, the number of these circuits in the drive strength control circuit 40 may differ accordingly.

Figure 5A:
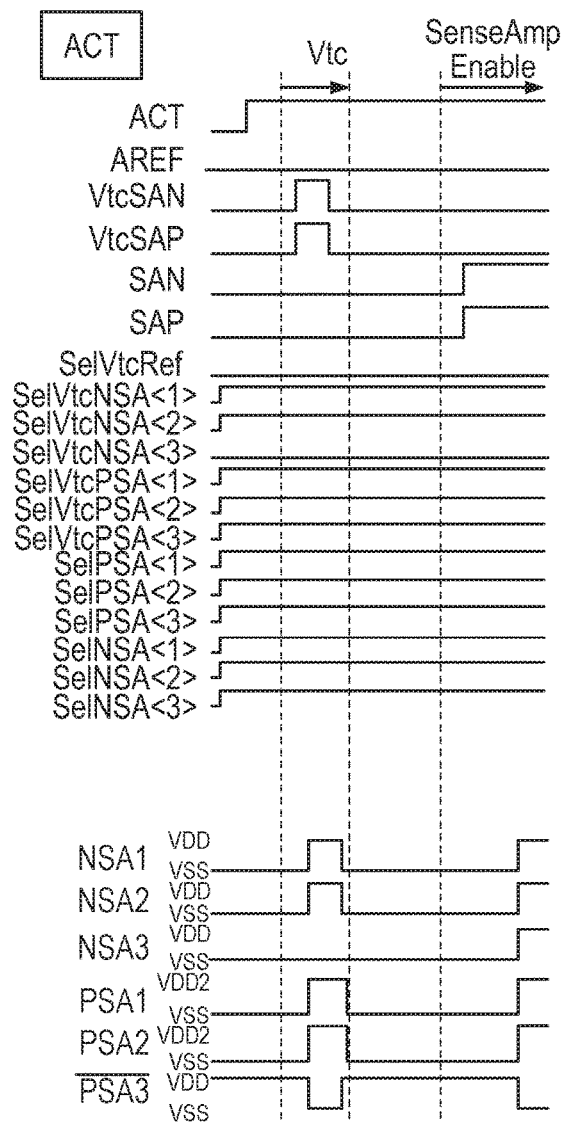
FIGS. 5A and 5B are timing diagrams of various signals related to sense amplifier operations and voltage compensation strength control according to an embodiment of the disclosure.
Figure 5B:
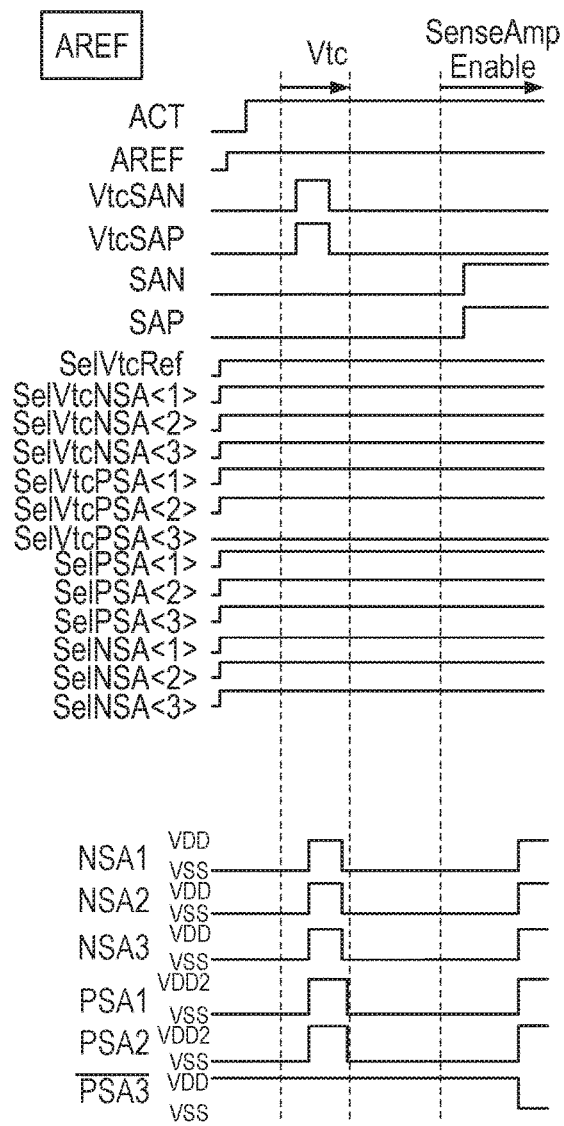

FIGS. 5A and 5B are timing diagrams of various signals related to sense amplifier operations and voltage compensation strength control according to an embodiment of the disclosure. For example, the various signals are either within and around the drive strength control circuit 40 in FIG. 4A or provided to the sense amplifier 31' of FIG. 3C. In some embodiments, a fuse logic circuit, such as the fuse logic circuit 42 in FIG. 4A may provide drive strength control signals SelVtcNSA1, SelVtcNSA2, SelVtcNSA3, SelVtcPSA1, SelVtcPSA2 and SelVtcPSA3 set to logic levels to "high, high, low, high, high, high" and drive strength control signals SelVtcAREFNSA1, SelVtcAREFNSA2, SelVtcAREFNSA3, SelVtcAREFPSA1, SelVtcAREFPSA2 and SelVtcAREFPSA3 set to logic levels to "high, high, high, high, high, low," in addition to drive strength control signals SelPSA1; SelPSA2, SelPSA3, SelNSA1, SelNSA2, and SelNSA3 set to logic levels to "high, high, high, high, high, high," respectively, FIG. 5A shows levels of various signals responsive to an activate command ACT as a native memory access operation, not in an auto refresh operation. Responsive to an activate command ACT, an internal command signal for activate command ACT is being set to a logic high level while an internal command signal for auto refresh command AREF is being set to a logic low level and a selection signal SelVtcRef is set to inactive (e.g.; at a logic low level) by the AREF detect logic circuit 402. Responsive to the inactive selection signal SelVtcRef, the plurality of selectors 403 may provide the drive strength control signals SelVtcNSA1, SelVtcNSA2, SelVtcNSA3 SelVtcPSA1, SelVtcPSA2, and SelVtcPSA3 set to logic levels to "high, high, low, high, high, high." In a threshold voltage compensation (VtC) phase, the timing logic circuit 401 provides the timing signal VtcSAN/VtcSAP set to a logic high level, and the timing signal SAN/SAP set to a logic low level. The plurality of control signal generator circuits 404 may provide the drive strength control signals SelVtcNSA1, SelVtcNSA2, SelVtcNSA3 SelVtcPSA1, SelVtcPSA2, and SelVtcPSA3 responsive to the active timing signal VtcSAN/VtcSAP. The drive strength control signals SelVtcNSA1, SelVtcNSA2, SelVtcNSA3 SelVtcPSA1, SelVtcPSA2, and SelVtcPSA3 set to logic levels to "high, high, low, high, high, high" cause the sense amplifier power control circuit 44 to provide control signals NSA1, NSA2, NSA3 PSA1, PSA2, and PSA3bar, set to logic levels to "high, high, low, high, high, low," respectively, which causes a combined drive strength of 85.6% by the transistors 331, 332, 333 in FIG. 3C and a combined drive strength of 100% by the transistors 321, 322, 323 in FIG. 3C. In a sense amplifier enable phase, the timing logic circuit 401 provides the timing signal VtcSAN/VtcSAP set to a logic low level, and the timing signal SAN/SAP set to a logic high level. The plurality of control signal generator circuits 404 may provide the drive strength control signals SelNSA1, SelNSA2, SelNSA3 SelPSA1, SelPSA2, SelPSA3 responsive to the active timing signal SAN/SAP. The drive strength control signals SelNSA1, SelNSA2, SelNSA3 SelPSA1, SelPSA2, SelPSA3 set to logic levels to "high, high, high, high, high, high" cause the sense amplifier power control circuit 44 to provide control signals NSA1, NSA2, NSA3 PSA1, PSA2, and PSA3bar, set to logic levels to "high, high, high, high, high, low," respectively, which causes a combined drive strength of 100% by the transistors 331, 332, 333, 321, 322, and 323 in FIG. 3C.

FIG. 5B shows levels of various signals responsive to an activate command ACT while in an auto refresh operation. As shown in FIG. 5B, responsive to an auto refresh command AREF, in addition to an internal command signal for activate command ACT being set to a logic high level, an internal command signal for auto refresh command AREF is being set to a logic high level, and the AREF detect logic circuit 402 provides a selection signal SelVtcRef set to active (e.g., at a logic high level). Responsive to the active selection signal SelVtcRef, the plurality of selectors 403 may provide the drive strength control signals SelVtcAREFNSA1, SelVtcAREFNSA2, SelVtcAREFNSA3 SelVtcAREFPSA1, SelVtcAREFPSA2, SelVtcAREFPSA3 set to logic levels to "high, high, high, high, high, low" in place of the drive control signals SelVtcNSA1, SelVtcNSA2, SelVtcNSA3 SelVtcPSA1, SelVtcPSA2, SelVtcPSA3. In a threshold voltage compensation (VtC) phase, the timing logic circuit 401 provides the timing signal VtcSAN/VtcSAP set to a logic high level, and the timing signal SAN/SAP set to a logic low level. The plurality of control signal generator circuits 404 may provide the drive strength control signals SelVtcNSA1, SelVtcNSA2, SelVtcNSA3 SelVtcPSA1, SelVtcPSA2, SelVtcPSA3 set to logic levels to "high, high, high, high, high, low" responsive to the active timing signal VtcSAN/VtcSAP. The drive strength control signals SelVtcNSA1, SelVtcNSA2, SelVtcNSA3 SelVtcPSA1, SelVtcPSA2, SelVtcPSA3 reflecting the drive strength control signals SelVtcAREFNSA1, SelVtcAREFNSA2, SelVtcAREFNSA3 SelVtcAREFPSA1, SelVtcAREFPSA2, SelVtcAREFPSA3 as shown in FIG. 5B cause the sense amplifier power control circuit 44 to provide control signals NSA1, NSA2, NSA3 PSA1, PSA2, and PSA3bar, set to logic levels to "high, high, high, high, high, high," respectively, which causes a combined drive strength of 100% by the transistors 331, 332, 333 in FIG. 3C and a combined drive strength of 85.6% by the transistors 321, 322, 323 in FIG. 3C. In a sense amplifier enable phase, the timing logic circuit 401 provides the timing signal VtcSAN/VtcSAP set to a logic low level, and the timing signal SAN/SAP set to a logic high level. The plurality of control signal generator circuits 404 may provide the drive strength control signals SelNSA1, SelNSA2, SelNSA3 SelPSA1, SelPSA2, SelPSA3 responsive to the active timing signal SAN/SAP. The drive strength control signals SelNSA1, SelNSA2, SelNSA3 SelPSA1, SelPSA2, SelPSA3 set to logic levels to "high, high, high, high, high, high" cause the sense amplifier power control circuit 44 to provide control signals NSA1, NSA2, NSA3 PSA1, PSA2, and PSA3bar, set to logic levels to "high, high, high, high, high, low," respectively, which causes a combined drive strength of 100% by the transistors 331, 332, 333, 321, 322 and 323 in FIG. 3C.

Figures 6A, 6B:
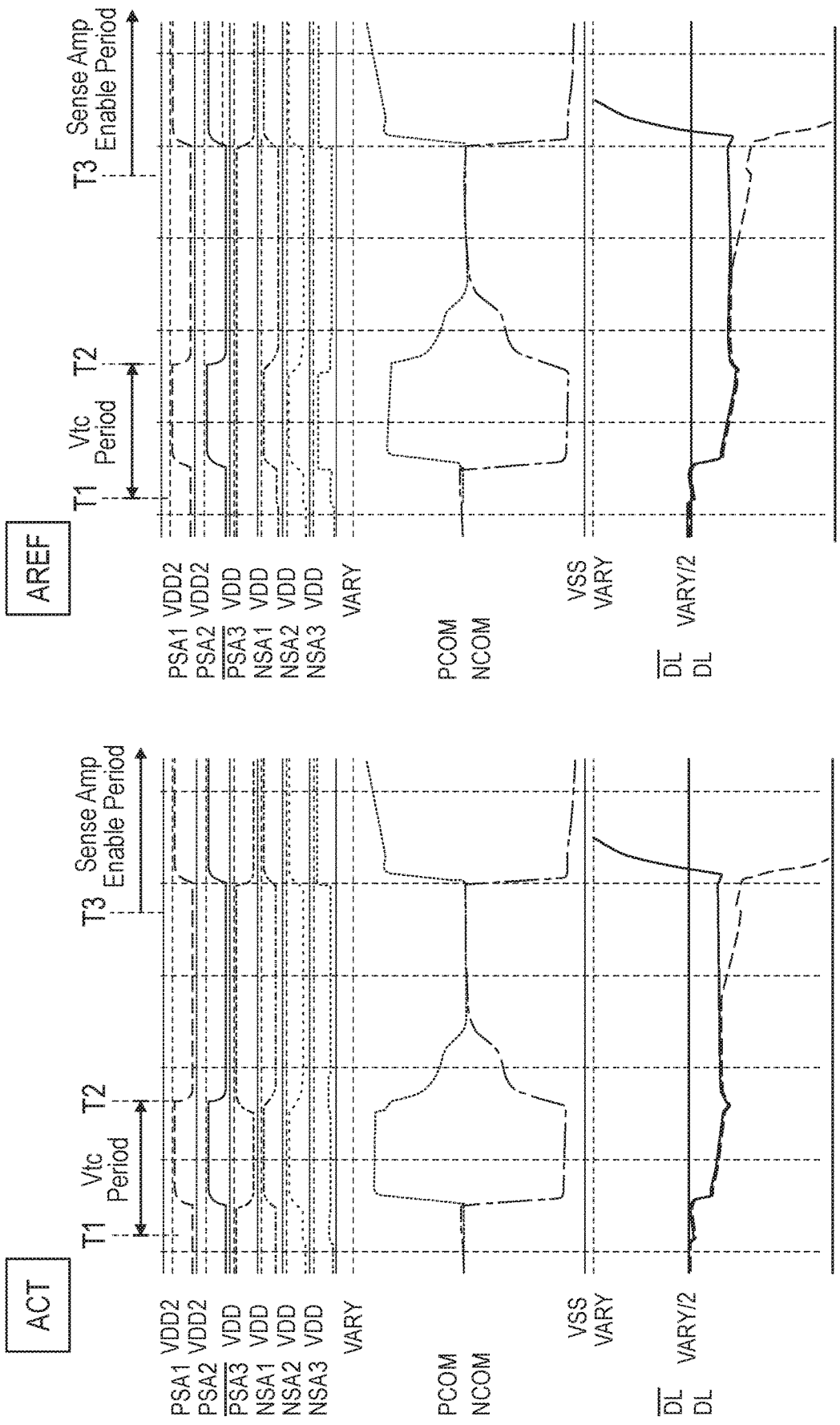
FIGS. 6A and 6B are timing diagrams of various signals during operations of a sense amplifier according to an embodiment of the disclosure.

FIGS. 6A and 6B are timing diagrams of various signals during operation of a sense amplifier according to an embodiment of the disclosure. For example, the sense amplifier may be the sense amplifier 30' of FIG. 3C. The various signals included are control signals PSA1, PSA2, PSA3bar, NSA1, NSA2, NSA3, signals on common nodes PCOM and NCOM and signals digit lines DL and DLb within the sense amplifier 30' of FIG. 3C.

FIG. 6A shows voltage levels of the various signals in a threshold voltage compensation (VtC) phase and a sense amplifier enable phase responsive to an active command ACT while not in an auto refresh operation. Prior to time T1, the sense amplifier and digit lines have been precharged during a precharge phase. The transistor 319 is activated by an active control signal BLPR to provide a voltage to a node 353. For example, the voltage may be a voltage VARY/2 that is about a half voltage of an array power supply voltage VARY. Prior to time T1, activated by the active control signal SAEQ, the transistor 318 provides a conductive path between a common node PCOM 320 and another common node NCOM 330 to equalize the respective node voltages. Further, activated by the active control signal SAEQ, the transistors 316 and 317 may provide the voltage VARY/2 to the common nodes PCOM 320 and NCOM 330. Also prior to time T1, the control signal ISO is at an active level (e.g., a power supply voltage VDD2 that is higher than the power supply voltage VDD, etc.) to activate the transistors 351 and 352 to couple a conductive path between the nodes 314 and 353 and the transistors 315 and 354, respectively. The isolation transistors 351 and 352 may couple the node 353 and a node 354 to the nodes 314 and 315 by an activated control signal ISO before T1, respectively, thus the voltage VARY/2 to the node 353 is provided to the nodes 314. The transistors 355 and 356 may be activated by the control signal BLCP, thus the voltage VARY/2 to the node 353 is also provided to the node 315 through the transistor 355, and the voltage VARY/2 to the node 315 may be provided to the node 354 via the isolation transistor 352.

The operation in the second phase, a threshold voltage compensation (VtC) phase between times T1 and T2 is described. Following time T1, the transistor 319 is deactivated by an inactive control signal BLPR (e.g., at the ground level) to no longer provide the voltage VARY/2 to the node 353. The transistors 316, 317 and 318 are deactivated by an inactive SAEQ signal to no longer provide the voltage VARY/2 to the common nodes PCOM 320 and NCOM 330, and the common nodes PCOM 320 and NCOM 330 are disconnected. Upon activation, the control signals PSA1, PSA2, and PSA3bar having the power supply voltages VDD2, VDD2 and VSS, set to logic levels to "high, high, low" may be provided to the transistors 321, 322, 323 that causes the common node PCOM 320 to have a higher voltage, closer to an array power supply voltage VARY. Upon the activation, the control signals NSA1, NSA2, and NSA3 having the power supply voltages VDD, VDD and VSS, set to logic levels to "high, high, low" may be provided to the transistors 331, 332, 333 that causes the common node NCOM 330 to have a lower voltage, closer to the power supply voltage VSS. Here, the combined drive strength provided by the transistors 321, 322 and 323 coupled to the common node PCOM 320 is about 100%, while the combined drive strength provided by the transistors 331, 332 and 333 coupled to the common node NCOM 330 is about 85.6%, less than 100% because the transistor 333 is turned off.

A difference between the respective voltages of nodes 314 and 315 may represent a sum of a threshold voltage offset between the threshold voltages of the transistors 310, 311, 312 and 313. By developing the voltages at the common nodes PCOM 320 and NCOM 330, threshold voltage compensation (e.g., for the transistors 310 and 311 and 312 and 313) between the common nodes PCOM 320 and NCOM 330 may be provided.

A next phase between times T2 and T3 is the third phase, the cell information sampling phase, performing a cell information sampling operation. In this phase, the control signals PSA1, PSA2, and PSA3bar having the power supply voltages VSS, VSS and VDD, set to logic levels to "low, low, high" may be provided to the transistors 321, 322, 323 that stop providing the array power supply voltage VARY to the common node PCOM 320. Also, the control signals NSA1, NSA2, and NSA3 having the power supply voltage VSS, set to logic levels to "low" may be provided to the transistors 331, 332, 333 that stop providing the power supply voltage VSS to the common node NCOM 330. Meanwhile, activated by the active control signal SAEQ, the transistor 318 provides the conductive path between the common nodes PCOM 320 and NCOM 330 to equalize the respective node voltages. Further, activated by the active control signal SAEQ, the transistors 316 and 317 may provide the voltage VARY/2 to the common nodes PCOM 320 and NCOM 330. Thus, the common nodes PCOM 320 and NCOM 330 have the voltage VARY/2.

An access line (e.g., a word line) may be activated (e.g., changed to a high voltage level) following time T2 to couple a memory cell to the digit line DL or to the digit line DLb, for example, as previously described with reference to FIG. 2. The memory cell coupled to the digit line DL or DLb causes a voltage change on the respective digit line based on the data state stored by the memory cell. For example, the memory cell may cause the voltage of the respective digit line to increase when the stored data state corresponds to the memory cell storing a positive charge. The change in the respective digit line DL or DLb from the memory cell is reflected on the corresponding node 314 or 315. The node 314 is coupled to a gate of the respective transistor 313 and the node 315 is coupled to a gate of respective transistor 312. Here, the transistors 355 and 356 are activated by the active control signal BLCP until time T2, a threshold voltage Vt of the transistor 312 may be observed on the node 315.

Following time T2, the transistors 355 and 356 are deactivated by the inactive control signal BLCP after time T2. The drain of the transistor 312 is disconnected from the gate of the transistor 312 and the node 315 by the deactivated transistor 355, and the drain of the transistor 313 is disconnected from the gate of the transistor 313 and the node 314 by the deactivated transistor 356.

Next operation between times T3 and T4 is the fourth phase, the sense amplifier enable phase. The control signal ISO changes to an active level to activate the transistors 351 and 352 to couple a conductive path between the nodes 314 and 353 and the nodes 315 and 354, respectively. After time T3, the control signals PSA1, PSA2, and PSA3bar having the power supply voltages VDD2, VDD2 and VSS, set to logic levels to "high, high, low" may be provided to the transistors 321, 322, 323 that causes the common node PCOM 320 to have a higher voltage, closer to an array power supply voltage VARY. Upon the activation, the control signals NSA1, NSA2, and NSA3 having the power supply voltages VDD, VDD and VDD, set to logic levels to "high, high, high" may be provided to the transistors 331, 332, 333 that causes the common node NCOM 330 to have a lower voltage, closer to the power supply voltage VSS. Here, the combined drive strength provided by the transistors 321, 322 and 323 coupled to the common node PCOM 320 is about 100%, while the combined drive strength provided by the transistors 331, 332 and 333 coupled to the common node NCOM 330 is about 100%.

The respective voltages at the common nodes PCOM 320 and NCOM 330 cause the voltage difference between the digit lines DL and DLb to be amplified by driving the sense nodes and digit lines to opposite voltage levels (e.g., high and low activation voltages) based on the voltage difference. The drive strength given to the common node NCOM 330 by the transistors 331, 332 and 333 is greater than the drive strength given at the VtC phase (T1-T2). In the present example, with the memory cell increasing the voltage of the digit line DL, the transistor 313 is activated to a greater degree than the transistor 312 to pull-down the node 354. As a result, the digit line DLb begins to be pulled down to the low activation voltage provided to the common power supply node (e.g., VSS), which in turn begins to activate the transistor 310 to pull-up the node 353. The drive strength given to the common node PCOM 320 by the transistors 321, 322 and 323 is the same as the drive strength given at the VtC phase (T1-T2). With the positive feedback loop of the transistor 313 and transistor 310, the node 354 is driven to the low activation voltage and the node 353 is driven to the high activation voltage. Prior the time T4, the access line WL becomes inactive (e.g., changes to an inactive (low) voltage level) to isolate the memory cell from the digit line DL.

During the sense amplifier activation phase the sense amplifier is activated by providing high and low activation voltages to the sense amplifier, and a voltage difference between the digit lines DL and DLb (e.g., resulting from the coupling of a memory cell to one of the digit lines) is amplified by driving the digit lines DL and DLb to opposite activation voltages based on the voltage difference. After completing the sense amplifier activation phase, the operation comes back to the precharge phase. The sense amplifier 300 is placed into the same precharged state as previously described at time T0, and is ready for another access operation.

FIG. 6B shows voltage levels of the various signals in a threshold voltage compensation (VtC) phase and a sense amplifier enable phase responsive to an active command ACT while in an auto refresh operation. Prior to time T1, during the precharge phase, the various signals are activated or deactivated in a similar manner as the various signals in FIG. 6A, thus not repeated.

The operation in the second phase, a threshold voltage compensation (VtC) phase between times T1 and T2 is described. Following time T1, the transistor 319 is deactivated by an inactive control signal BLPR (e.g., at the ground level) to no longer provide the voltage VARY/2 to the node 353. The transistors 316, 317 and 318 are deactivated by an inactive SAEQ signal to no longer provide the voltage VARY/2 to the common nodes PCOM 320 and NCOM 330, and the common nodes PCOM 320 and NCOM 330 are disconnected. Upon activation, the control signals PSA1, PSA2, and PSA3bar having the power supply voltages VDD2, VDD2 and VDD, set to logic levels to "high, high, high" may be provided to the transistors 321, 322, 323 that causes the common node PCOM 320 to have a higher voltage, closer to an array power supply voltage VARY. Upon the activation, the control signals NSA1, NSA2, and NSA3 having the power supply voltages VDD, VDI) and VDD, set to logic levels to "high, high, high" may be provided to the transistors 331, 332, 333 that causes the common node NCOM 330 to have a lower voltage, closer to the power supply voltage VSS. Here, the combined drive strength provided by the transistors 321, 322 and 323 coupled to the common node PCOM 320 is about 85.6% because of the high logic level of PSA3bar given to the transistor 323, while the combined drive strength provided by the transistors 331, 332 and 333 coupled to the common node NCOM 330 is about 100%. Because the drive strength given to the common node NCOM 330 is greater and the drive strength given to the common node PCOM is less, the voltages of the common nodes PCOM 320 and NCOM 330 is lower than the voltages of the common nodes PCOM 320 and NCOM 330 after the VtC phase in the native memory access operation in FIG. 6A. By developing the voltages at the common nodes PCOM 320 and NCOM 330, threshold voltage compensation (e.g., for the transistors 310 and 311 and 312 and 313) between the common nodes PCOM 320 and NCOM 330 may be provided, differently from the VtC phase in the native memory access operation as shown in FIG. 6A, and digit lines DL and DLb have lower voltages than in the voltages of the digit lines DL and DLb after the VtC phase in the native memory access operation of FIG. 6A.

A difference between the respective voltages of nodes 314 and 315 may represent a sum of the signal difference on digit lines DL and DLb and the threshold voltage offset between the threshold voltages of the transistors 310, 311, 312 and 313 between the common nodes PCOM 320 and NCOM 330. Thus, the threshold voltage compensation (e.g., for the transistors 310 and 311 and 312 and 313) may be provided in addition to the signal difference.

A next phase between times T2 and T3 is the cell information sampling phase when a cell information sampling operation is performed. In this phase, the control signals PSA PSA2, and PSA3bar cause the transistors 321, 322, 323 to stop providing the array power supply voltage VARY to the common node PCOM 320, and the control signals NSA1, NSA2, and NSA3 cause the transistors 331, 332, 333 to stop providing the power supply voltage VSS to the common node NCOM 330. The active control signal SAEQ causes the transistor 318 to equalize the respective node voltages of PCOM 320 and NCOM 330 to equalize the respective node voltages, and further causes the transistors 316 and 317 to provide the voltage VARY/2 to the common nodes PCOM 320 and NCOM 330.

An access line (e.g., a word line) may be activated (e.g., changed to a high voltage level) following time T2 to couple a memory cell to the digit line DL or to the digit line DLb, for example, as previously described with reference to FIG. 2. The memory cell coupled to the digit line DL or DLb causes a voltage change on the respective digit line based on the data state stored by the memory cell. For example, the memory cell may cause the voltage of the respective digit line to increase when the stored data state corresponds to the memory cell storing a positive charge. The change in the respective digit line DL or DLb from the memory cell is reflected on the corresponding node 314 or 315. The node 314 is coupled to a gate of the respective transistor 313 and the node 315 is coupled to a gate of respective transistor 312. While different sections (e.g., a set of sense amplifiers and memory cells in a memory cell array) may be activated together, because the voltages at the common nodes PCOM 320 and NCOM 330 were set closer to a power rail in the VtC phase in the auto refresh operation compared to the VtC phase while not in the auto refresh operation as shown in FIG. 6A, a sense amplifier reference voltage can be maintained across native memory access operations and auto refresh operations.

In the example of FIGS. 6A and 6B, each of the control signals PSA1, PSA2, PSA3bar, NSA1, NSA2 and NSA3 are shown with a particular timing and a particular voltage relative to the other voltages and control signals. However, embodiments of the disclosure include other voltage and signal timings different from those described with reference to FIGS. 6A and 6B. Thus, the scope of the disclosure is not limited to the particular example of FIGS. 6A and 6B.

Figure 7:
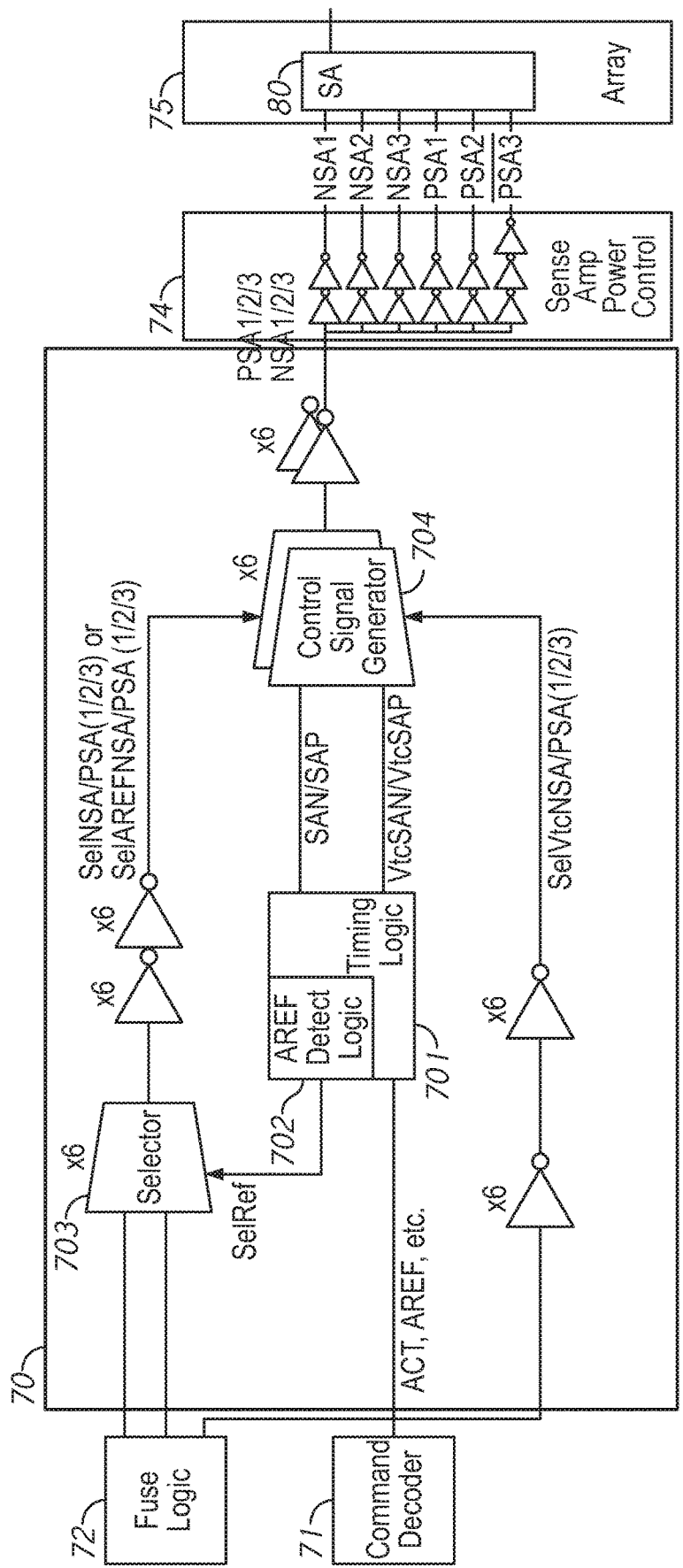
FIG. 7 is a schematic diagram of a drive strength control circuit according to an embodiment of the disclosure.

FIG. 7 is a schematic diagram of a drive strength control circuit 70 according to an embodiment of the disclosure. The drive strength control circuit 70 may be included in a peripheral region of a semiconductor device 100 of FIG. 1. For example, the bank logic circuit 126 of FIG. 1 may include the drive strength control circuit 70. Alternatively, the row decoder 130 of FIG. 1 may include a bank logic circuit including the drive control circuit 70. A command decoder 71 may provide internal command signals to the drive strength control circuit 70. For example, the command decoder 71 may be the command decoder 125 of FIG. 1. For example, the internal command signals may include a command signal indicative of an activation responsive to an activate command ACT and a command signal indicative of auto refresh (AREF) operation.

The drive strength control circuit 70 may include a timing logic circuit 702. The timing logic circuit 702 may receive the internal command signals from the command decoder 71. Responsive to the internal command signals, the timing logic circuit 702 may provide a timing signal SAN/SAP that may be set to an active state during a sense amplifier enable phase, and a timing signal VtcSAN/VtcSAP that may be set to an active state during a threshold voltage compensation (VtC) phase.

The drive strength control circuit 70 may include an AREF detect logic circuit 702. For example, the AREF detect logic circuit may be the AREF detect logic circuit 128 of FIG. 1. The AREF detect logic circuit 702 may receive the internal command signals from the command decoder 71. For each internal command signal, the AREF detect logic circuit 702 may determine whether the internal command signal is indicative of an auto refresh (AREF) command. If the internal command signal is indicative of the AREF command, then the AREF detect logic circuit 702 may provide a selection signal SelRef in an active state to a plurality of selectors 703 in the drive strength control circuit 70. If the internal command signal is not indicative of the AREF command (e.g., a command indicative of a native memory access operation), then the AREF detect logic circuit 702 may provide the selection signal SelRef in an inactive state to the plurality of selectors 703. A fuse logic circuit 72 may store drive strength information regarding drive strengths of transistors in sense amplifiers associated with a threshold voltage compensation phase or a sense amplifier enable phase. For example, the fuse logic circuit 72 may be the fuse logic circuit 126. The fuse logic circuit 72 may provide drive strength control signals regarding drive strengths of transistors, such as drive strength control signals SelNSA1, SelNSA2, SelNSA3, SelPSA1, SelPSA and SelPSA3, associated with drive strengths of the transistors 331, 332, 333, 321, 322 and 323 of FIG. 3C during the sense amplifier enable phase responsive to an activate command ACT while auto refresh operation is not executed (e.g., a native memory access operation is being executed). The fuse logic circuit 72 may further provide drive strength control signals SelVtcNSA1, SelVtcNSA2, SelVtcNSA3 SelVtcPSA1, SelVtcPSA2, and SelVtcPSA3 associated with drive strengths of the transistors 331, 332, 333, 321, 322 and 323 during a threshold voltage compensation (VtC) phase. Furthermore, the fuse logic circuit 72 may provide drive strength control signals SelAREFNSA1, SelAREFNSA2, SelAREFNSA3, SelAREFPSA1, SelAREFPSA2 and SelAREFPSA3 associated with drive strengths of the transistors 331, 332, 333, 321, 322 and 323 during the sense amplifier enable phase in an auto refresh operation responsive to an auto refresh command AREF.

The plurality of selectors 703 may receive the selection signal SelRef from the AREF detect logic circuit 702, and receive the drive strength control signals SelNSA1, SelNSA2, SelNSA3 SelPSA1, SelPSA2, SelPSA3, SelAREFNSA1, SelAREFNSA2, SelAREFNSA3, SelAREFPSA1, SelAREFPSA2 and SelAREFPSA3 from the fuse logic circuit 72. Responsive to the inactive state of the selection signal SelRef indicative of an operation that is not an auto refresh operation (e.g, in a native memory operation), the plurality of selectors 703 may provide the drive strength control signals SelNSA1, SelNSA2, SelNSA3 SelPSA1, SelPSA2, and SelPSA3. Responsive to the active state of the selection signal SelRef indicative of an auto refresh operation responsive to an auto refresh command AREF, the plurality of selectors 703 may provide the drive strength control signals SelAREFNSA1, SelAREFNSA2, SelAREFNSA3, SelAREFPSA1, SelAREFPSA2 and SelAREFPSA3.

The drive strength control circuit 70 may include a plurality of control signal generator circuits 704. The plurality of control signal generator circuits 704 may receive the timing signals, such as the timing signals SAN/SAP and VtcSAN/VtcSAP, from the timing logic circuit 701. The plurality of control signal generator circuits 704 may receive either the drive strength control signals SelNSA1, SelNSA2, SelNSA3, SelPSA1, SelPSA2 and SelPSA3 or the drive strength control signals SelAREFNSA1, SelAREFNSA2, SelAREFNSA3, SelAREFPSA1, SelAREFPSA2 and SelAREFPSA3 to be used during the sense amplifier enable phase from the plurality of selectors 703. The plurality of control signal generator circuits 704 may also receive the drive strength control signals SelVtcNSA1, SelVtcNSA2, SelVtcNSA3 SelVtcPSA1, SelVtcPSA2 to be used during the threshold voltage compensation phase from the fuse logic circuit 72. Responsive to the active timing signal SAN/SAP indicative of being in the sense amplifier enable phase, the plurality of control signal generator circuits 704 may provide inversed signals of the drive strength control signals received from the plurality of selectors 703 as inverse transistor activation signals PSA1bar, PSA2bar, PSA3bar, NSA1bar, NSA2bar, and NSA3bar respectively. Responsive to the active timing signal VtcSAN/VtcSAP indicative of being in the threshold voltage compensation phase, the plurality of control signal generator circuits 704 may provide inversed signals of the drive strength control signals SelVtcPSA1, SelVtcPSA2, SelVtcPSA3, SelVtcNSA1, SelVtcNSA2, SelVtcNSA3 as the inverse transistor activation signals PSA1bar, PSA2bar, PSA3bar, NSA1bar, NSA2bar, and NSA3bar respectively.

A sense amplifier power control circuit 74 may receive the inverse transistor activation signals PSA1bar, PSA2bar, PSA3bar, NSA1bar, NSA2bar, and NSA3bar and provide PSA1, PSA2, PSA3bar, NSA1, NSA2, and NSA3 to sense amplifiers 80 in a memory cell array 75. For example, the sense amplifier power control circuit 74, the memory cell array 75 and the sense amplifiers 80 may be the sense amplifier power control circuit 135, the memory cell array 145 and the sense amplifiers 150 in FIG. 1.

The plurality of selectors 703 and the plurality of control signal generators 704 may be provided in a pre-process of generating each control signal of the control signals that are transistor activation signals PSA1, PSA2, PSA3bar, NSA1, NSA2, and NSA3 provided from the sense amplifier power control circuit 74 to the transistors 321, 322, 323, 331, 332, and 333. Thus, the number of the plurality of selectors 703 and the plurality of control signal generators 704 in the drive strength control circuit 70 is six in FIG. 7A. However, depending on a number of transistors used for adjusting a drive strength of a sense amplifier, the number of these circuits in the drive strength control circuit 70 may differ accordingly.

FIGS. 8A and 8B are timing diagrams of various signals related to sense amplifier operations and voltage compensation strength control according to an embodiment of the disclosure. For example, the various signals are either within and around the drive strength control circuit 70 in FIG. 7 or provided to the sense amplifier 30 of FIG. 3C. In some embodiments, a fuse logic circuit, such as the fuse logic circuit 72 in FIG. 7 may provide drive strength control signals SelNSA1, SelNSA2, SelNSA3 SelPSA1, SelPSA2 set to logic levels to "high, high, high, high, high, high", drive strength control signals SelAREFNSA1, SelVAREFNSA2, SelAREFNSA3, SelAREFPSA1, SelAREFPSA2 and SelAREFPSA3 set to logic levels to "high, high, low, high, high, low," and drive strength control signals SelVtcPSA1, SelVtcPSA2, SelVtcPSA3, SelVtcNSA1, SelVtcNSA2, and SelVtcNSA3 set to logic levels to "high, high, low, high, high, high," respectively, FIG. 8A shows levels of various signals responsive to an activate command ACT as a native memory access operation, not in an auto refresh operation. Responsive to an activate command ACT, an internal command signal for activate command ACT is being set to a logic high level while an internal command signal for auto refresh command AREF is being set to a logic low level and a selection signal SelRef is set to inactive (e.g., at a logic low level) by the AREF detect logic circuit 702. Responsive to the inactive selection signal SelRef, the plurality of selectors 703 may provide the drive strength control signals SelNSA1, SelNSA2, SelNSA3 SelPSA1, SelPSA2, SelPSA3 set to logic levels to "high, high, low, high, high, high." In a threshold voltage compensation (VtC) phase, the timing logic circuit 701 provides the timing signal VtcSAN/VtcSAP set to a logic high level, and the timing signal SAN/SAP set to a logic low level. The plurality of control signal generator circuits 704 may provide the drive strength control signals SelVtcNSA1, SelVtcNSA2, SelVtcNSA3 SelVtcPSA1, SelVtcPSA2, SelVtcPSA3 responsive to the active timing signal VtcSAN/VtcSAP. The drive strength control signals SelVtcNSA1, SelVtcNSA2, SelVtcNSA3 SelVtcPSA1, SelVtcPSA2, SelVtcPSA3 set to logic levels to "high, high, low, high, high, high" cause the sense amplifier power control circuit 74 to provide control signals NSA1, NSA2, NSA3 PSA1, PSA2, and PSA3bar, set to logic levels to "high, high, low, high, high, low," respectively, which causes a combined drive strength of 85.6% by the transistors 331, 332, 333 in FIG. 3C and a combined drive strength of 100% by the transistors 321, 322, 323 in FIG. 3C. In a sense amplifier enable phase, the timing logic circuit 701 provides the timing signal VtcSAN/VtcSAP set to a logic low level, and the timing signal SAN/SAP set to a logic high level. The plurality of control signal generator circuits 704 may provide the drive strength control signals SelNSA1, SelNSA2, SelNSA3 SelPSA1, SelPSA2, SelPSA3 responsive to the active timing signal SAN/SAP. The drive strength control signals SelNSA1, SelNSA2, SelNSA3 SelPSA1, SelPSA2, SelPSA3 set to logic levels to "high, high, high, high, high, high" cause the sense amplifier power control circuit 74 to provide control signals NSA1, NSA2, NSA3 PSA1, PSA2, and PSA3bar, set to logic levels to "high, high, high, high, high, low," respectively, which causes a combined drive strength of 100% by the transistors 331, 332, 333, 321, 322, and 323 in FIG. 3C.

FIG. 8B shows levels of various signals responsive to an activate command ACT while in an auto refresh operation.

As shown in FIG. 8B, responsive to an auto refresh command AREF, in addition to an internal command signal for activate command ACT being set to a logic high level, an internal command signal for auto refresh command AREF is being set to a logic high level, and the AREF detect logic circuit 702 provides a selection signal SelRef set to active (e.g., at a logic high level). Responsive to the active selection signal SelRef, the plurality of selectors 703 may provide the drive strength control signals SelAREFNSA1, SelAREFNSA2, SelAREFNSA3 SelAREFPSA1, SelAREFPSA2, SelAREFPSA3 set to logic levels to "high, high, low, high, high, low" in place of the drive control signals SelNSA1, SelVtcNSA2, SelVtcNSA3 SelVtcPSA1, SelVtcPSA2, SelVtcPSA3. In a threshold voltage compensation (VtC) phase, the timing logic circuit 701 provides the timing signal VtcSAN/VtcSAP set to a logic high level, and the timing signal SAN/SAP set to a logic low level. The plurality of control signal generator circuits 404 may provide the drive strength control signals SelVtcNSA1, SelVtcNSA2, SelVtcNSA3 SelVtcPSA1, SelVtcPSA2, SelVtcPSA3 set to logic levels to "high, high, low, high, high, high" responsive to the active timing signal VtcSAN/VtcSAP. The drive strength control signals SelVtcNSA1, SelVtcNSA2, SelVtcNSA3 SelVtcPSA1, SelVtcPSA2, SelVtcPSA3 cause the sense amplifier power control circuit 74 to provide control signals NSA1, NSA2, NSA3 PSA1, PSA2, and PSA3bar, set to logic levels to "high, high, low, high, high, low," respectively, which causes a combined drive strength of 85.6% by the transistors 331, 332, 333 in FIG. 3C and a combined drive strength of 100% by the transistors 321, 322, 323 in FIG. 3C. In a sense amplifier enable phase, the timing logic circuit 701 provides the timing signal VtcSAN/VtcSAP set to a logic low level, and the timing signal SAN/SAP set to a logic high level. The plurality of control signal generator circuits 704 may provide the drive strength control signals SelAREFNSA1, SelAREFNSA2, SelAREWFNSA3 SelAREFPSA1, SelAREFPSA2, SelAREFPSA3 set to logic levels to "high, high, low, high, high, low" as responsive to the active timing signal SAN/SAP. The drive strength control signals SelNSA1, SelNSA2, SelNSA3 SelPSA1, SelPSA2, SelPSA3 reflecting the drive strength control signals SelAREFNSA1, SelAREFNSA2, SelAREWFNSA3 SelAREFPSA1, SelAREFPSA2, SelAREFPSA3 as shown in FIG. 8B cause the sense amplifier power control circuit 74 to provide control signals NSA1, NSA2, NSA3 PSA1, PSA2, and PSA3bar, set to logic levels to "high, high, low, high, high, high," respectively, which causes a combined drive strength of 85.6% by the transistors 331, 332, 333, 321, 322 and 323 in FIG. 3C.

In the manner described above, a combination of control signals may provide adjustable drive strengths across different memory operations, such as native memory operations and auto refresh operation may be provided in a sense amplifier enable phase. Particularly, by providing the control signals of different activation combinations, responsive to different commands; such as the activate command ACT and the auto refresh command AREF, different drive strength can be given to the sense amplifier in the sense amplifier enable phase.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   a sense amplifier coupled to a pair of digit lines and further coupled to a first power node, the sense amplifier configured to amplify a voltage difference between the digit lines of the pair; and
   a power supply circuit configured to receive a power supply voltage;
   wherein the power supply circuit is configured to provide the power supply voltage based on a first drive strength during a threshold voltage compensation phase before a sense amplifier is enabled in a first memory operation, and further configured to provide the power supply voltage based on a second drive strength during a threshold voltage compensation phase before the sense amplifier is enabled in a second memory operation.

2. The apparatus of claim 1, wherein the first memory operation is a native memory operation and the second memory operation is an auto refresh operation.

3. The apparatus of claim 1, wherein the power supply circuit comprises:
   a plurality of transistors coupled to the first power node and further configured to receive the power supply voltage and provide the same to the sense amplifier based on a combined drive strength of the plurality of transistors;
   wherein the plurality of transistors have a first combined drive strength as the first drive strength in a first memory operation, wherein the plurality of transistors have a second combined drive strength as the second drive strength in a second memory operation.

4. The apparatus of claim 3, wherein the plurality of transistors includes a first transistor having a first transistor drive strength and a second transistor having a second transistor drive strength different from the first transistor drive strength.

5. The apparatus of claim 3, wherein the plurality of transistors includes a first transistor having the first conductivity type and a second transistor having the second conductivity type.

6. The apparatus of claim 3, wherein the plurality of transistors includes a first transistor configured to be activated in the first memory operation and further configured to be deactivated in the second memory operation.

7. The apparatus of claim 3, further comprising a control circuit configured to provide a plurality of control signals to the plurality of transistors,
   wherein the plurality of control signals is indicative of the first drive strength in the first memory operation and wherein the plurality of control signals is indicative of the second drive strength in the second memory operation.

8. The apparatus of claim 7, wherein the plurality of transistors includes a first transistor;
   wherein the plurality of control signal includes a control signal, wherein the control signal in a first state is configured to activate the first transistor in the first memory operation and wherein the control signal in a second state is configured to deactivate the first transistor in the first memory operation.

9. The apparatus of claim 7, wherein the control circuit is configured to provide the plurality of control signals in the threshold voltage compensation phase of the first memory operation and in the threshold voltage compensation phase of the second memory operation.

10. The apparatus of claim 7, wherein the control circuit is configured to provide the plurality of control signals while the sense amplifier is enabled in the first memory operation and while the sense amplifier is enabled in the second memory operation.

11. The apparatus of claim 1, wherein the power supply circuit is configured to provide the power supply voltage based on a third drive strength while the sense amplifier is enabled in the first memory operation, and further configured to provide the power supply voltage based on a fourth drive strength during the sense amplifier is enabled in the second memory operation.

12. A method, comprising:
receiving a power supply by a power supply circuit;
setting a first drive strength of the power supply circuit during a threshold voltage compensation phase before a sense amplifier is enabled in a first memory operation;
setting a second drive strength of the power supply circuit during a threshold voltage compensation phase before the sense amplifier is enabled in a second memory operation; and
providing power to a first power node based on the drive strength, wherein the first power node is coupled to a sense amplifier.

13. The method of claim 12, wherein the first memory operation is a native memory operation and the second memory operation is an auto refresh operation.

14. The method of claim 12, further comprising:
receiving the power supply by a plurality of transistors and providing power to the first power node based on a combined drive strength as the drive strength;
causing the plurality of transistor to have the first drive strength in a first memory operation; and
causing the plurality of transistor to have the second drive strength in a second memory operation.

15. The method of claim 14, further comprising:
providing a plurality of control signals indicative of the first drive strength to the plurality of transistors in the first memory operation; and
providing the plurality of control signals indicative of the second drive strength to the plurality of transistors in the second memory operation.

16. The method of claim 15, further comprising:
activating a first transistor of the plurality of transistors responsive to a control signal of the plurality of control signals, wherein the plurality of control signals is indicative of the first drive strength; and
deactivating the first transistor responsive to the control signal of the plurality of control signals, wherein the plurality of control signals is indicative of the second drive strength.

17. The apparatus of claim 15, wherein the control circuit is configured to provide the plurality of control signals in the threshold voltage compensation phase of the first memory operation and in the threshold voltage compensation phase of the second memory operation.

18. The apparatus of claim 15, wherein the control circuit is configured to provide the plurality of control signals while the sense amplifier is enabled in the first memory operation and while the sense amplifier is enabled in the second memory operation.

19. The method of claim 12, further comprising:
setting a third drive strength of the power supply circuit while the sense amplifier is enabled in the first memory operation; and
setting a fourth drive strength of the power supply circuit while the sense amplifier is enabled in the second memory operation.

* * * * *